(12) United States Patent
Zhen et al.

(10) Patent No.: US 10,943,781 B2
(45) Date of Patent: Mar. 9, 2021

(54) MANUFACTURING METHOD FOR LIGHT EMITTING DEVICE, LIGHT EMITTING DEVICE, AND HYBRID LIGHT EMITTING DEVICE

(71) Applicant: Najing Technology Corporation Limited, Zhejiang (CN)

(72) Inventors: Changgua Zhen, Zhejiang (CN); Xinyan Gu, Zhejiang (CN)

(73) Assignee: Najing Technology Corporation Limited, Hangzhou (CN)

( * ) Notice: Subject to any disclaimer, the term of this patent is extended or adjusted under 35 U.S.C. 154(b) by 0 days.

(21) Appl. No.: 16/328,290

(22) PCT Filed: Aug. 24, 2017

(86) PCT No.: PCT/CN2017/098811
§ 371 (c)(1),
(2) Date: Feb. 26, 2019

(87) PCT Pub. No.: WO2018/036542
PCT Pub. Date: Mar. 1, 2018

(65) Prior Publication Data
US 2019/0214604 A1     Jul. 11, 2019

(30) Foreign Application Priority Data

Aug. 26, 2016 (CN) .......................... 201610738773.9
Aug. 26, 2016 (CN) .......................... 201610742776.X
Aug. 26, 2016 (CN) .......................... 201610747047.3

(51) Int. Cl.
*H01L 21/02* (2006.01)
*H01L 51/00* (2006.01)
*H01L 21/48* (2006.01)
*H01L 31/0352* (2006.01)
(Continued)

(52) U.S. Cl.
CPC .. *H01L 21/02296* (2013.01); *H01L 21/02288* (2013.01); *H01L 21/4867* (2013.01);
(Continued)

(58) Field of Classification Search
CPC ......... H01L 21/02282; H01L 21/02288; H01L 21/02296; H01L 21/4867; H01L 21/6715;
(Continued)

(56) References Cited

U.S. PATENT DOCUMENTS

2005/0206041 A1    9/2005   Temple et al.
2006/0249732 A1    11/2006  Shirasaki et al.
(Continued)

FOREIGN PATENT DOCUMENTS

CN        1404624 A       3/2003
CN        1822904 A       8/2006
(Continued)

*Primary Examiner* — Eduardo A Rodela
(74) *Attorney, Agent, or Firm* — Gang Yu

(57) ABSTRACT

A manufacturing method for a light emitting device, a light emitting device, and a hybrid light emitting device, the manufacturing method comprises the following steps: step S1: disposing a mask plate having a plurality of hollow portions on a substrate; step S2: applying, by using a solution method, ink on a surface of the substrate by using the hollow portions; and step S3: drying or solidifying the ink on the surface of the substrate to form a light emitting layer or a functional layer.

18 Claims, 4 Drawing Sheets

(51) Int. Cl.
*H01L 51/56* (2006.01)
*H01L 27/32* (2006.01)
*H01L 51/50* (2006.01)

(52) U.S. Cl.
CPC .. *H01L 31/035218* (2013.01); *H01L 51/0003* (2013.01); *H01L 51/0004* (2013.01); *H01L 51/0005* (2013.01); *H01L 51/0012* (2013.01); *H01L 51/0026* (2013.01); *H01L 51/56* (2013.01); *H01L 27/3211* (2013.01); *H01L 51/502* (2013.01); *H01L 51/5056* (2013.01); *H01L 51/5072* (2013.01); *H01L 51/5088* (2013.01); *H01L 51/5092* (2013.01)

(58) Field of Classification Search
CPC ............. H01L 23/4828; H01L 23/5328; H01L 51/0003; H01L 51/0019; H01L 51/0022; H01L 51/0004; H01L 51/0005; H01L 51/5012; H01L 51/502; H01L 2224/82102; H01L 31/035209; H01L 31/035218
See application file for complete search history.

(56) References Cited

U.S. PATENT DOCUMENTS

| | | | | |
|---|---|---|---|---|
| 2013/0126839 A1* | 5/2013 | Matsushima | ....... | H01L 27/3246 257/40 |
| 2013/0277649 A1* | 10/2013 | Gregory | .............. | H01L 27/3246 257/40 |
| 2013/0277669 A1* | 10/2013 | Krebs | ................. | H01L 51/4233 257/43 |
| 2015/0145924 A1 | 5/2015 | Shimofuku | | |
| 2017/0133614 A1* | 5/2017 | Gu | ........................... | H01L 51/50 |
| 2017/0207405 A1* | 7/2017 | Lescouet | ............. | H01L 51/0021 |
| 2019/0181196 A1* | 6/2019 | Dai | ..................... | H01L 51/0005 |
| 2019/0181197 A1* | 6/2019 | Hu | ...................... | H01L 27/3246 |

FOREIGN PATENT DOCUMENTS

| | | | |
|---|---|---|---|
| CN | 1873913 | A | 12/2006 |
| CN | 101076211 | A | 11/2007 |
| CN | 101207185 | A | 6/2008 |
| CN | 103151461 | A | 6/2013 |
| CN | 103241025 | A | 8/2013 |
| CN | 104617130 | A | 5/2015 |
| CN | 104733505 | A | 6/2015 |
| CN | 104795426 | A | 7/2015 |
| CN | 105118845 | A | 12/2015 |
| CN | 105529408 | A | 4/2016 |
| CN | 105575997 | A | 5/2016 |
| CN | 105667085 | A | 6/2016 |
| CN | 105789484 | A | 7/2016 |
| CN | 105870157 | A | 8/2016 |
| CN | 106158916 | A | 11/2016 |
| CN | 106252528 | A | 12/2016 |
| CN | 106696501 | A | 5/2017 |
| JP | S5868041 | A | 4/1983 |

* cited by examiner a hydrophilic area and a hydrophobic area are formed on a first surface of a light transmitting substrate; 

the surface modified mask plate with multiple hollow portions are set on the first surface of the light transmitting substrate, and the hollow portions in the surface modified mask plate are set corresponding to the hydrophilic area or the hydrophobic area, the surface modified mask plate is provided with a modified surface, the modified surface includes a first modified surface and a second modified surface, the first modified surface is set around the hollow portions, the modified surface except the first modified surface is the second modified surface, and the first modified surface and the second modified surface are different and are respectively selected from one of a hydrophilic surface and a hydrophobic surface, and the first modified surface is positioned at one side, away from the first surface of the light transmitting substrate, of the surface modified mask plate; 

the first modified surface is the hydrophobic surface, so the hydrophobic quantum dot ink enters the hydrophobic area through the hollow portions, or the first modified surface is the hydrophilic surface, so the hydrophilic quantum dot ink enters the hydrophilic area through the hollow portions; 

the quantum dot ink in the hydrophilic area or the hydrophobic area is dried. 

Fig. 5

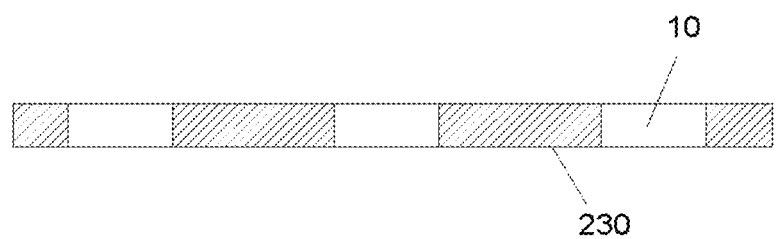

Fig. 6 (NEW)

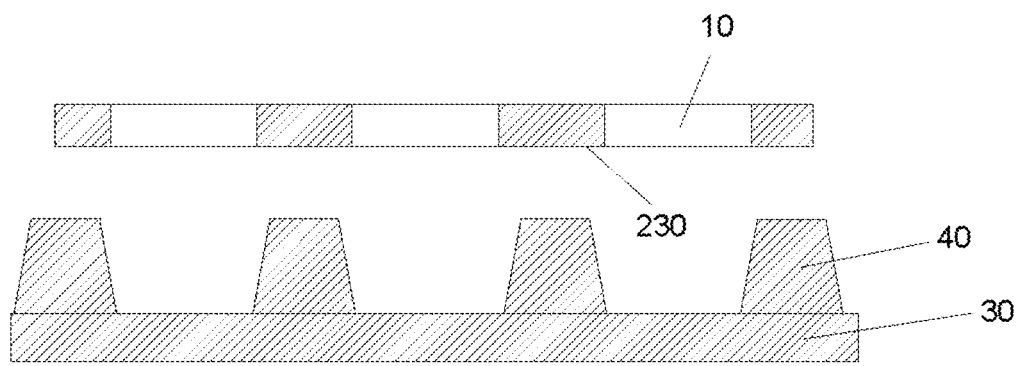
Fig. 7 (NEW)
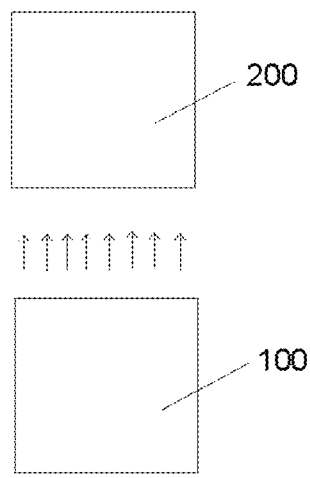
Fig. 8 (NEW)

MANUFACTURING METHOD FOR LIGHT EMITTING DEVICE, LIGHT EMITTING DEVICE, AND HYBRID LIGHT EMITTING DEVICE

TECHNICAL FIELD

The disclosure relates to the field of optical technologies, and in particular, to a manufacturing method for a light emitting device, the light emitting device, and a hybrid light emitting device.

BACKGROUND

Along with the continuous development of science and technology, requirements of people on quality of a display is continuously improved, A quantum dots light emitting diode (QLED) display is known as a most representative display technology in future through high color purity, color saturation and wide color gamut thereof. An existing QLED device is manufactured by mainly using a solution method, such as inkjet printing, silk-screen printing, spin-coating, slit-coating, and spray-coating, because a displayed pixel is very small, coating of an existing sub-pixel generally use the inkjet printing technology to perform a selective coating, namely in a RGB sub-pixel groove constructed by a pixel separating structure, a nozzle is used for successively printing R, G, B quantum dot material ink. Because the efficiency of an existing blue light QLED device is lower, it is somewhat difficult to construct the QLED device of the RGB display by directly using quantum dots, but blue light development of traditional LED and OLED is more mature, so a mode of realizing the RGB display by a RG optically-combined LED or OLED electric blue light of the quantum dots may be used, and it may be rapidly realized in a short time.

However, in the above inkjet printing technology, a form of a droplet sprayed by the nozzle is very unstable, many small droplets may be observed frequently around a main droplet, the dispersed small droplets are easy to deviate from their original positions, and fall into a neighboring sub-pixel area, so that the material falling quantity in each sub-pixel is different or a color mixture problem occurs, thereby final performance of a light emitting device is affected or color difference is generated, and a yield rate of products is reduced.

The OLED generally uses an evaporation method to prepare the above light emitting device, namely an upper part of a substrate is covered by a mask plate and multiple times of the vacuum hot evaporation are performed to prepare the RGB pixel, for example, while a R pixel is evaporated, a position corresponding to a GB pixel is covered by using the mask plate so as not to be evaporated, in the above method, because a utilization rate of material is lower, the cost is extremely high, based on the above deficiency, an existing solution method for manufacturing the above OLED electroluminescent device with the RGB pixel is extensively researched, in order to counter against the QLED electroluminescent device good at a manufacturing process of the solution method, the QLED device which has wide color gamut, accurate and controllable colors and the like is known as the optimal display technology in the next generation. Whatever it is the OLED display which continuously occupies a traditional LCD display market, or the QLED display which is vigorously developed in order to replace the OLED so that the display technology is directly transited from the LCD to the QLED, manufacturing process of the solution method is a key of the existing research.

However, about the spray-coating technology in the solution method, because the material guidance quality of a spraying device is lower, it is only suitable for area coating, and is not suitable for point coating; and about the inkjet printing technology in the solution method preparation technology, in order to guarantee injection precision of ink, a precision inkjet printing device generally needs to be used, so the device investment is too expensive.

While an optical quantum dot color film is prepared, a black matrix or a pixel separating structure manufactured by using a yellow light technology is complicated in process, and expensive in cost, and the investment of the precision inkjet printing device is expensive too, the difficulty is increased for popularization of a new technology.

SUMMARY

The disclosure mainly aims to provide a manufacturing method for a light emitting device, the light emitting device and a hybrid light emitting device, and solve a problem in the prior art that the light emitting device causes a color difference because of color mixture.

In order to achieve the above purpose, according to one aspect of the disclosure, a manufacturing method for a light emitting device is provided, the manufacturing method includes the following steps: step S1, a mask plate having a plurality of hollow portions is disposed on a substrate; step S2, by using a solution method, ink is applied on a surface of the substrate by using the hollow portions; and step S3, the ink is dried or solidified on the surface of the substrate to form a light emitting layer or a functional layer.

Further, the ink is a quantum dot material ink, the manufacturing method further includes a process of at least one time of repeatedly performing the step S1 to the step S3, in each time of the repeated process, the hollow portions of the used mask plate correspond to different areas of the substrate, the light emitting colors of the used ink are different.

Further, the mask plate in the step S1 has a modified surface, the modified surface includes a surface of one side, away from the substrate, of the mask plate, the modified surface has the hydrophilicity or hydrophobicity; the ink used in the step S2 and the modified surface have the different hydrophobicity-hydrophilicity.

Further, the modified surface further includes a surface of one side, adjacent to the substrate, of the mask plate.

Further, while the modified surface is a hydrophobic surface, the manufacturing method further includes a process of forming the modified surface, the process of forming the modified surface includes the following steps: step S01, the mask plate is immersed in solution with a hydrophobic material, so that the hydrophobic material is fixed on the surface of the mask plate, preferably the hydrophobic material is a fluoric silane coupling agent; and step S02, the mask plate fixed with the hydrophobic material is separated from the solution, and drying treatment is performed on the mask plate, so as to form the modified surface with the hydrophobicity.

Further, the manufacturing method further includes a process of pre-processing the mask plate, the pre-processing process includes the following steps: ultraviolet ozone photolysis oxidization is performed on the surface of the mask plate, so that the hydrophilic surface of the mask plate is completely exposed.

Further, the substrate in the step S1 is provided with a pixel separating structure, and the pixel separating structure is provided with multiple mutually separated sub-pixel areas, and the hollow portions are set corresponding to each sub-pixel area; in the step S2, the ink enters the corresponding sub-pixel areas through the hollow portions.

Further, the surface of the substrate in the step S1 has a hydrophilic area and a hydrophobic area, the hollow portions are set corresponding to the hydrophilic area or the hydrophobic area; in the step S2, the hydrophobic ink enters the hydrophobic area through the hollow portions, or the hydrophilic ink enters the hydrophilic area through the hollow portions.

Further, the ink is any one of a hole injection material ink, a hole transmission material ink, an electron injection material ink or an electron transmission material ink, in the step S3, the ink is dried, so as to form a corresponding hole injection layer, a hole transmission layer, an electron injection layer or an electron transmission layer; or the ink is the quantum dot material ink or an organic light emitting material ink, in the step S3, the ink is dried, so as to form a corresponding quantum dot light emitting layer or an organic light emitting layer.

Further, the ink is an electrode material ink, in the step S3, the ink is dried, so as to form a corresponding electrode layer.

Further, the ink is any one of a the hole injection material ink, the hole transmission material ink, the electron injection material ink, the electrode material ink or the electron transmission material ink, in the step S3, the ink is solidified, so as to form a corresponding hole injection layer, a hole transmission layer, an electron injection layer, an electrode layer or an electron transmission layer; or the ink is the quantum dot material ink or the organic light emitting material ink, in the step S3, the ink is solidified, so as to form a corresponding quantum dot light emitting layer or an organic light emitting layer.

Further, in the step S2, a spray-coating technology or an inkjet printing technology is used so that the ink is disposed on the surface of the substrate through the hollow portions, and the spray-coating technology is ultrasonic spray-coating preferably.

According to another aspect of the disclosure, a light emitting device is provided, the light emitting device is prepared by the above manufacturing method, the light emitting device is an electroluminescence device or a photoluminescence device.

According to another aspect of the disclosure, a hybrid light emitting device is further provided, the hybrid light emitting device includes an electroluminescence device and a photoluminescence device set on the light emitting side of the electroluminescence device, the electroluminescence device and/or the photoluminescence device is prepared by the manufacturing method.

According to another aspect of the disclosure, a surface modification mask plate is further provided, the surface modification mask plate is provided with multiple hollow portions, the surface modification mask plate has a modified surface, the modified surface includes a first modified surface and a second modified surface, the first modified surface is set around the hollow portions, the modified surface except the first modified surface is the second modified surface, and the first modified surface and the second modified surface are different and are respectively selected from one of a hydrophilic surface and a hydrophobic surface.

According to another aspect of the disclosure, a surface modifying method for the mask plate is further provided, the surface modifying method includes the following steps: modification is performed on the surface of the mask plate with multiple hollow portions, so as to form the modified surface, the modified surface includes a first modified surface and a second modified surface, the first modified surface is set around the hollow portions, the modified surface except the first modified surface is the second modified surface, and the first modified surface and the second modified surface are different and respectively has the hydrophilicity or the hydrophobicity.

Further, the surface modifying method includes the following steps: step S01', the mask plate is immersed in solution with a hydrophobic material, so that the hydrophobic material is fixed on the surface of the mask plate, preferably the hydrophobic material is a fluoric silane coupling agent; step S02', the mask plate fixed with the hydrophobic material is separated from the solution, and drying treatment or solidifying treatment is performed on the mask plate; and step S03', a first photomask is set on the first surface of the mask plate, the first photomask is formed by multiple first shielding portions and a first light transmitting portion connected to each first shielding portion, the first shielding portions correspond to the hollow portions one by one, and the area of each first shielding portion is greater than the area of each hollow portion corresponding to the first shielding portion, ultraviolet ozone photolysis oxidization is performed on the first surface of the mask plate through the first photomask, and the ultraviolet ozone photolysis oxidization is performed on the second surface, opposite to the first surface, of the mask plate, so as to form a second modified surface with hydrophilicity, the rest surface of the mask plate forms a first modified surface with hydrophobicity; or a second photomask is set on the mask plate, the second photomask is formed by multiple second light transmitting portions and a second shielding portion connected to each second light transmitting portion, and the second light transmitting portions correspond to the hollow portions one by one, and the area of each second light transmitting portion is greater than the area of each hollow portion corresponding to the second light transmitting portion, the ultraviolet ozone photolysis oxidization is performed on the mask plate, so that the surface, corresponding to the second light transmitting portions, of the mask plate forms the first modified surface with the hydrophilicity, and the rest surface of the mask plate forms the second modified surface with the hydrophobicity.

According to another aspect of the disclosure, a manufacturing method for an electroluminescence device is further provided, the manufacturing method includes the following steps: step S1', a first electrode substrate with a pixel separating structure is provided, the pixel separating structure is provided with multiple mutually separated sub-pixel areas; step S2', the above surface modified mask plate is disposed on one side, provided with the pixel separating structure, of the first electrode substrate, the first modified surface of the surface modified mask plate is set away from the first electrode substrate, and one or more hollow portions of the surface modified mask plate are set corresponding to each sub-pixel area in at least partial sub-pixel areas; step S3', by using the solution method, the ink having the same hydrophobicity-hydrophilicity as the first modified surface of the surface modified mask plate enters the corresponding sub-pixel area through the hollow portions; and step S4', the ink in the sub-pixel area is dried or solidified, so as to form a light emitting layer or a functional layer.

Further, the ink is any one of a hole injection material ink, a hole transmission material ink, an electron injection material ink or an electron transmission material ink, in the step S4', the ink is dried, so as to form a corresponding hole injection layer, a hole transmission layer, an electron injection layer or an electron transmission layer; or the ink is any one of a quantum dot material ink and a organic light emitting material ink, in the step S4', the ink is dried, so as to form a corresponding quantum dot light emitting layer or an organic light emitting layer.

Further, while the ink is the quantum dot material ink, the manufacturing method further includes a process of at least one time of repeatedly performing the step S2' to the step S4', in each time of the repeated process, the hollow portions of the used surface modified mask plate correspond to the different sub-pixel areas, the light emitting colors of the used ink are different.

Further, in the step S3', a spray-coating technology or an inkjet printing technology is used so that the ink enters the sub-pixel area through the hollow portions, and the spray-coating technology is ultrasonic spray-coating preferably.

Further, the ultrasonic frequency used by the ultrasonic spray-coating is 45-180 kHz.

Further, after the step S4', the manufacturing method further includes the following steps: step S5', while the light emitting layer is formed in the step S4', one side, away from the first electrode substrate, of the light emitting layer is provided with a second electrode; or step S5', while the functional layer is formed in the step S4', the functional layer is a first injection layer or a first transmission layer, one side, away from the first electrode substrate, of the first injection layer or the first transmission layer is provided with the light emitting layer, and one side, away from the first electrode substrate, of the light emitting layer is provided with the second electrode.

Further, while the functional layer is formed in the step S4', and the functional layer is the first injection layer, in the step S5', the manufacturing method further includes the following steps: before a process of installing the light emitting layer, repeatedly performing the steps from S2' to S4', so that a first transmission layer is set on a surface of the first injection layer; after the process of installing the light emitting layer, repeatedly performing the steps from S2' to S4', so that a second transmission layer is set on a surface of the light emitting layer; and after a process of installing the second transmission layer, repeatedly performing the steps from S2' to S4', so that a second injection layer is set on a surface of second transmission layer.

According to another aspect of the disclosure, a manufacturing method for a quantum dot film is further provided, the manufacturing method for the quantum dot film includes the following steps: step a, a hydrophilic area and a hydrophobic area are formed on a first surface of a light transmitting substrate; step b, the surface modified mask plate with multiple hollow portions are set on the first surface of the light transmitting substrate, and the hollow portions in the surface modified mask plate are set corresponding to the hydrophilic area or the hydrophobic area, the surface modified mask plate has a modified surface, the modified surface includes a first modified surface and a second modified surface, the first modified surface is set around the hollow portions, the modified surface except the first modified surface is the second modified surface, the first modified surface and the second modified surface are different and are respectively selected from one of a hydrophilic surface and a hydrophobic surface, and the first modified surface is positioned at one side, away from the first surface of the light transmitting substrate, of the surface modified mask plate; step c, the first modified surface is the hydrophobic surface, so the hydrophobic quantum dot ink enters the hydrophobic area through the hollow portions, or the first modified surface is the hydrophilic surface, so the hydrophilic ink containing the quantum dot enters the hydrophilic area through the hollow portions; and step d, the quantum dot ink in the hydrophilic area or the hydrophobic area is dried. The above quantum dot ink is the above quantum dot material ink.

Further, the step a includes the following steps: step S001, a raw material including a first reaction raw material is set on the first surface of the light transmitting substrate; step S002, the first reaction raw material positioned in a first area is covered, and ultraviolet irradiation is performed on the first reaction raw material positioned in a second area, the first reaction raw material forms a second shielding area in the second area; step S003, the first reaction raw material in the first area is removed, the first area and the second shielding area are provided with a second reaction raw material; step S004, the second reaction raw material positioned in the second shielding area is covered, and the ultraviolet irradiation is performed on the second reaction raw material positioned in the first area, the second reaction raw material positioned forms a first shielding area in the first area, and the second reaction raw material on the second shielding area is removed, the first reaction raw material and the second reaction raw material are respectively selected from one of a hydrophilic reactant and a hydrophobic reactant, and the hydrophobicity-hydrophilicity of the hydrophilic reactant and the hydrophobic reactant are opposite, the first shielding area and the second shielding area correspondingly form a hydrophilic area and a hydrophobic area.

Further, the manufacturing method further includes a process of preparing a surface modified mask plate: step S01, the mask plate is immersed in solution with a hydrophobic material, so that the hydrophobic material is fixed on a surface of the mask plate, preferably the hydrophobic material is a fluoric silane coupling agent; step S02, the mask plate fixed with the hydrophobic material is separated from the solution, and drying treatment is performed on the mask plate, and drying treatment or solidifying treatment is performed on the mask plate; and S03, a first photomask is set on a first surface of the mask plate, the first photomask is formed by multiple first shielding portions and a first light transmitting portion connected to each first shielding portion, the first shielding portions correspond to the hollow portions one by one, and the area of each first shielding portion is greater than the area of each hollow portion corresponding to the first shielding portion, ultraviolet ozone photolysis oxidization is performed on the first surface of the mask plate through the first photomask, and the ultraviolet ozone photolysis oxidization is performed on a second surface, opposite to the first surface, of the mask plate, so as to form a second modified surface with hydrophilicity, the rest surface of the mask plate forms a first modified surface with hydrophobicity; or a second photomask is set on the mask plate, the second photomask is formed by multiple second light transmitting portions and a second shielding portion connected to each second light transmitting portion, and the second light transmitting portions correspond to the hollow portions one by one, and the area of each second light transmitting portion is greater than the area of each hollow portion corresponding to the second light transmitting portion, the ultraviolet ozone photolysis oxidization is performed on the mask plate, so that the surface, corresponding to the second light transmitting portions, of the mask plate forms the first modified surface with the hydrophilicity, and the rest surface of the mask plate forms the second modified surface with the hydrophobicity.

Further, a spray-coating technology or an inkjet printing technology is used in the step c so that the quantum dot ink enters a hydrophilic area or a hydrophobic area through the hollow portions.

Further, the spray-coating technology is ultrasonic spray-coating.

Further, the first surface forms multiple hydrophilic areas and multiple hydrophobic areas, and each hydrophilic area and each hydrophobic area are alternately arranged.

Further, the hydrophilic quantum dot ink includes a hydrophilic quantum dot, and the hydrophilic quantum dot is a quantum dot of which a ligand contains a hydrophilic group at surface; and the hydrophobic quantum dot ink includes a hydrophobic quantum dot, and the hydrophobic quantum dot is a quantum dot of which a ligand contains a hydrophobic group at surface.

Further, the quantum dot in the quantum dot ink is a red quantum dot and/or a green quantum dot.

According to another aspect of the disclosure, a quantum dot film is further provided, the quantum dot film is manufactured by the above manufacturing method.

According to another aspect of the disclosure, a display device is further provided, the display device includes an electroluminescence device and a quantum dot film set on the light emitting side of the electroluminescence device, the quantum dot film is the above quantum dot film.

Applying the technical scheme of the disclosure, a manufacturing method for a light emitting device is provided, according to the manufacturing method, a mask plate with multiple hollow portions are disposed on a substrate, and ink is applied on the surface of the substrate through the hollow portions by using a solution method, the ink on the surface f the substrate is dried or solidified, so as to form a light emitting layer or a functional layer, so the mask plate is used for preventing the ink from being dispersed to other color areas, a color mixture problem is effectively avoided, and the color precision of the light emitting device is improved.

Besides the above described purposes, features and advantages, the disclosure further has other purposes, features and advantages. The disclosure is further described in detail below in combination with the drawings.

BRIEF DESCRIPTION OF THE DRAWINGS

The accompanying drawings, which constitute a part of this application, are used to provide a further understanding of the disclosure, and the exemplary embodiments of the disclosure and the description thereof are used to explain the disclosure, but do not constitute improper limitations to the disclosure. In the drawings:

FIG. 5 shows a flow schematic diagram of a manufacturing method of a quantum dot film provided by an embodiment of the disclosure.

FIG. 6 shows a sectional view of a mask plate having a plurality of hollow portions provided by an embodiment of the disclosure.

FIG. 7 shows a sectional view of a substrate provided with a pixel separating structure and a mask plate which disposed on the substrate provided by an embodiment of the disclosure.

FIG. 8 shows a structural diagram of a hybrid light emitting device which comprise an electroluminescence device and a photoluminescence device provided by an embodiment of the disclosure.

DETAILED DESCRIPTION OF THE EMBODIMENTS

Figure 1:
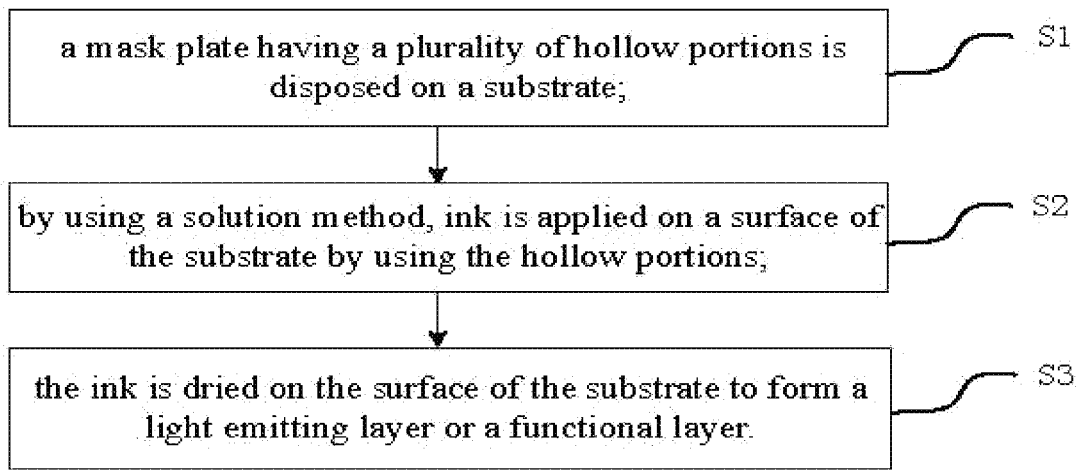
FIG. 1 shows a flow schematic diagram of a manufacturing method of a light emitting device provided by an embodiment of the disclosure.

It is to be noted that the embodiments in the disclosure and the features in the embodiments may be mutually combined in the case without conflicting. The disclosure is described in detail below with reference to the drawings in combination with the embodiments.

In order to make those skilled in the art to understand the scheme of the disclosure better, the technical scheme in the embodiment of the disclosure is clearly and completely described below in combination with the drawings in the embodiment of the disclosure, apparently, the described embodiments are only a part of the embodiments of the disclosure, but are not all of the embodiments. Based on the embodiments in the disclosure, all other embodiments acquired by those of ordinary skill in the art under the precondition without the creative work fall within the scope of protection of the disclosure.

It is to be noted that terms 'first', 'second' and the like in the description and claims and the above drawings of the disclosure are used for distinguishing similar objects, and are not intended to describe a specific sequence or a precedence order. It is to be understood that such used data may be interchanged in a proper situation, so that the embodiments of the disclosure described herein may be implemented in sequences besides those graphically-represented or described herein. Besides, terms 'include' and 'have' and any variations thereof are intendent to cover the non-exclusive inclusion, for example, a process, a method, a system, a product or a device containing a series of steps or units is not limited to clearly list those steps or units, but may include other steps or units which are not clearly listed or inherent to these process, method, product or device.

The quantum dot material ink in the application may be also named as quantum dot ink, the ink includes water-like ink with a smaller viscosity, besides, the ink also includes glue-like ink with a larger viscosity.

The meaning of the hydrophilicity and the hydrophobicity in the application is that the hydrophilic ink is ink with polar group molecules, has the large affinity to water, may absorb water molecules, or is dissolved in water. The hydrophilic surface is a surface of a solid material formed by the molecules with the polar groups, and it is easily wetted by the water. The feature of easily wetting by water is the hydrophilicity of a substance. The hydrophobicity is a physical property that a molecule (a hydrophobe) is repelled with water chemically, the hydrophobic ink is ink which contains the molecules with the physical property of mutually repelling with the water, the hydrophobic surface is a surface of a solid material formed by the molecules with the physical property of mutually repelling with the water. For example, if a droplet (aqueous) is dispersed, a larger area is wetted, a contact angle is less than 90 degrees, so the surface is regarded to be hydrophilic. If the droplet forms a sphere, and does not contact with the surface nearly, the contact angle of the droplet is greater than 90 degrees, the surface is regarded to be hydrophobic, or hydrophobic.

As the introduction in the background, in the existing inkjet printing technology, because the ink droplets sprayed by the nozzle are dispersed, the dispersed small droplets are easy to deviate from original positions, and fall into a neighboring sub-pixel area, so that a color mixture problem is caused, thereby a color difference is generated because the final color of the light emitting device is affected. The research is performed in allusion to the above problem by an inventor of the application, a manufacturing method for a light emitting device is provided, as shown in FIG. 1, the manufacturing method includes the following steps: step S1, a mask plate having a plurality of hollow portions is disposed on a substrate; step S2: by using a solution method, ink is applied on a surface of the substrate by using the hollow portions; and step S3: the ink is dried on the surface of the substrate to form a light emitting layer or a functional layer.

The inventor of the application further provides a manufacturing method for a light emitting device, the manufacturing method further includes the following steps: step S1, a mask plate having a plurality of hollow portions is disposed on a substrate; step S2: by using a solution method, ink is applied on a surface of the substrate by using the hollow portions; and step S3: the ink is solidified on the surface of the substrate to form a light emitting layer or a functional layer.

According to the above manufacturing method of the disclosure, the mask plate with multiple hollow portions is disposed on the substrate, and the hollow portions correspond to a target area on the substrate, a non-target area on the substrate may correspond to the hollow portions of the mask plate or correspond to a non-hollow portions of the mask plate, ink is applied on the surface of the substrate through the hollow portion by using a solution method, and the ink on the surface of the substrate is dried or solidified, so as to form a light emitting layer or a functional layer, so that the mask plate is used for preventing the ink from being dispersed to other color areas, especially preventing the quantum dot ink from being diffused to other neighboring areas, a color mixture problem is effectively avoided, and the color precision of the light emitting device is improved.

The above solution method is selected from one or more combinations of inkjet printing, silk-screen printing, spin-coating, slit-coating, and spray-coating, the above ink may include a glue-like substance with a larger viscosity, or substance with a smaller viscosity, preferably the viscosity of the above ink is 50 cps or less.

Exemplary implementation modes of the manufacturing method for the light emitting device provided according to the disclosure is described in more detail below, these exemplary implementation modes may be implemented in multiple different modes, and are not ought to be explained to be only limited to the implementation modes described herein. It is to be understood that these implementation modes are provided for completely and integrally disclosing the application, and the conception of these implementation modes are adequately delivered to those of ordinary skill in the art.

The ink in the application may be any one of a hole injection material ink, a hole transmission material ink, an electron injection material ink, and an electrode material ink or an electron transmission material ink, in the step S3, the ink is dried, so as to form a corresponding hole injection layer, a hole transmission layer, an electron injection layer, an electrode layer or an electron transmission layer; and the ink in the application may be quantum dot material ink or organic light emitting material ink, in the step S3, the ink is dried or solidified, so as to form a corresponding quantum dot light emitting layer or an organic light emitting layer. In addition, in order to make the light emitting device has multiple colors of emitting light, preferably the quantum dot in the above quantum dot material ink is independently selected from any one or more of a red quantum dot, a blue quantum dot and a green quantum dot.

While the above ink is the quantum dot material ink, after the step S3 is executed, the manufacturing method further includes a process of at least one time of repeatedly performing the step S1 to the step S3, in each time of the repeated process, the hollow portions of the used mask plate correspond to the different areas of the substrate, the light emitting colors of the used ink are different. Through installing the different light emitting colors of the quantum dot material ink on a target area of the substrate and drying or solidifying, the final light emitting color of the light emitting device is adjusted; and through installing the red quantum dot, the blue quantum dot and the green quantum dot on the different positions of the substrate surface, all-color display of the RGB is realized.

In addition, according to the different material types, the above ink may be sorted as the hydrophilic ink and the hydrophobic ink. While the above quantum dot material ink is the hydrophilic ink, the above hydrophilic ink includes a hydrophilic quantum dot, and the hydrophilic quantum dot is a quantum dot of which a surface ligand contains a hydrophilic group, preferably the hydrophilic group is a carboxyl, an amidogen, a hydroxyl or a sulfydryl; while the above quantum dot material ink is the hydrophobic ink, the above hydrophobic ink includes a hydrophobic quantum dot, and the hydrophobic quantum dot is a quantum dot of which a surface ligand contains a hydrophobic group, preferably the hydrophobic group is a hydrocarbon chain or an ester group.

The above quantum dot material ink with the hydrophilicity or the hydrophobicity may also include a curable resin or a monomer thereof and a solvent (or named as a dispersing agent). The solvent may be selected from long chain hydrocarbon of which a boiling point is between 40 and 250 DEG C, a mixture of alcohol, ester and ether as an organic solvent. Preferably, the hydrocarbon is liner chain or branched chain alkane, for example, the hydrocarbon is C6-10 alkane. The organic solvent may be chlorobenzene, orthodichlorobenzene, tetrahydrofuran, anisole, morpholine, methylbenzene, ortho-xylene, m-xylene, p-xylene, alkylbenzene, nitrobenzene, normal hexane, cyclohexane, n-heptane, cycloheptane, dioxane, dichloromethane, trichloromethane, dichloroethane, chloroform, chlorobenzene, 1,4-dioxahexane, 1,2-dichloroethane, 1,1,1-trichloroethane, 1,1,2,2-tetrachloroethane, tetrahydronaphthalene, decalin, N,N-dimethylformamide, N,N-dimethylacetamide, dimethyl sulfoxide chloroform, tetrahydrofuran, dichloromethane, methylbenzene, normal hexane, methyl alcohol, ethyl alcohol, propyl alcohol, butyl alcohol, acetone, dioxane, dimethylformamide and dimethyl sulfoxide. The curable resin is selected from an epoxy resin, an acrylic resin, an organic silicon resin, or a curable resin crosslinking-formed by a corresponding monomer. The above hydrophilic and hydrophobic quantum dot ink may further include a cross-linking agent with a double-bond, a light curing agent or a heat curing agent and the like.

In a preferable implementation mode, the mask plate in the step S1 has a modified surface, the modified surface includes a surface of one side, away from a substrate, of the mask plate. The modified surface has the hydrophilicity or the hydrophobicity; the ink used in the step S2 and the modified surface have the different hydrophobicity-hydrophilicity. Through installing the hydrophobic ink on a corresponding position on the substrate through the hollow portions of the mask plate with a hydrophilic modified surface, or installing the hydrophilic ink on the corresponding position of the substrate through the hollow portion of the mask plate with a hydrophobic modified surface, the ink is enabled not to be adhered to the mask plate, so the guidance quality of a material is improved, thereby the spray-coating technology in the solution method may be used for manufacturing the pixel, and an inkjet printing device in lower precision may be used for manufacturing the pixel, the needed cost of using a precision inkjet printing device is reduced.

In the above preferable implementation mode, in order to further improve the guidance quality of the material by using the mask plate, more preferably, as shown in FIG. 6, the modified surface further includes a surface of one side 230, adjacent to the substrate, of the mask plate. Through enabling one side, adjacent to the substrate, of the mask plate to have the modified surface, and the modified surface and the ink have the different hydrophobicity-hydrophilicity, the ink with the hydrophilicity or the hydrophobicity may not be adhered to the surface of one side adjacent to the substrate while passing through the hollow portions.

In the prior art, a metal material or other hydrophilic anti-ultraviolet anti-aging material are used for preparing the mask plate generally. Because an oxidation layer on the metal surface is affiliative with water, so the surfaces of most of metals are hydrophilic, the hydrophobic ink may be set on the corresponding position on the substrate through the hollow portions of the above mask plate, and may not be adhered to the surface modified mask plate, thereby the guidance quality of the hydrophobic material is improved.

In order to acquire the mask plate with the hydrophobic modified surface, preferably, the above manufacturing method further includes a process of forming the modified surface: step S01, the mask plate is immerged in solution with a hydrophobic material, so that the hydrophobic material is fixed on the surface of the mask plate; and step S02, the mask plate fixed with the hydrophobic material is separated from the solution, and drying treatment or solidifying treatment is performed on the mask plate, so as to form the modified surface with the hydrophobicity. Through the above preferable implementation mode, the hydrophilic ink may be set on the corresponding position on the substrate through the hollow portions of the above mask plate, and may not be adhered to the surface modified mask plate, thereby the guidance quality of the hydrophilic material is improved. In order to make the prepared mask plate has the better hydrophobicity, preferably the hydrophobic material is a fluoric silane coupling agent.

In addition, in order to adequately use the hydrophilicity of the mask plate, preferably, the process of forming the modified surface includes the following steps: ultraviolet ozone photolysis oxidization is performed on the surface of the mask plate, so as to form the modified surface with the hydrophilicity. Through performing the ultraviolet ozone photolysis oxidization on the surface of the mask plate, various greasy dirt and hemical substances reserved on the surface of the mask plate are removed and the hydrophilic metal surface is exposed, in the above optional embodiment, the hydrophobic fluoric silane coupling agent is used for removing and exposing the hydrophilic metal surface, so that the mask plate with the hydrophilic modified surface is obtained. Technology conditions of the above ultraviolet ozone photolysis oxidization may be set by those skilled in the art according to the convenient art.

Because the mask plate with the modified surface is used or the surface of the mask plate is completely exposed, the spray-coating technology or the inkjet printing technology may be used in the above step S2 so that the ink is set on the surface of the substrate through the hollow portions. Preferably the viscosity of the above hydrophilic ink or the hydrophobic ink is less than or equal to 50 cps, so the ink supply may be controlled well by a device nozzle; and in order to guarantee that the ink may be effectively atomized by the nozzle, preferably, the above spray-coating technology is ultrasonic spray-coating, in order to improve the spray-coating effect of the preferable hydrophilic ink or the hydrophobic ink, an ultrasonic frequency used by the preferable ultrasonic spray-coating is 45-180 kHz, the viscosity of the preferable hydrophilic ink or hydrophobic ink is less than or equal to 10 cps.

In a preferable implementation mode, the substrate in the step S1 is provided with a pixel separating structure, and the pixel separating structure is provided with multiple mutually separated sub-pixel areas, and the hollow portions are set corresponding to each sub-pixel area, as shown in FIG. 7, the mask plate is disposed on substrate 30, substrate 30 is provided with a pixel separating structure 40; in the step S2, the ink enters the corresponding sub-pixel area through the hollow portions. The above pixel separating structure may effectively prevent the ink color mixture between the different sub-pixel areas, and the color accuracy is improved.

In order to reduce the effect of the color accuracy because the mask plate is deformed while the light emitting device is prepared in large area so that a quantity or a position of the ink falling into the corresponding sub-pixel area produces a deviation, the above mask plate may contact with the surface of one side, provided with the pixel separating structure, of the substrate; in addition, in order to make the hydrophilic ink or the hydrophobic ink more accurately enter the sub-pixel area of the pixel separating structure through the hollow portions of the mask plate, preferably, the area of the above hollow portions is less than or equal to the area of the corresponding sub-pixel area, more preferably, the shape of the hollow portions is the same as the shape of the corresponding sub-pixel area.

More preferably, a naked surface of the pixel separating structure includes a hydrophilic surface or a hydrophobic surface. While the above naked surface of the pixel separating structure is the hydrophilic surface, in the step S2, the hydrophobic ink is set on the surface of the substrate through the hollow portions; while the above naked surface of the pixel separating structure is the hydrophobic surface, in the step S2, the hydrophilic ink is set on the surface of the substrate through the hollow portions, so that the surface of the above pixel separating structure and the ink have the different hydrophobicity-hydrophilicity, in the step of forming a light emitting layer or a functional layer, the ink may not be reserved on the upper surface or the side wall of the pixel separating structure, and flowed back to the pixel area under the effect of gravity, so the color mixture between the neighboring pixel areas is effectively prevented.

While the above manufacturing method of the disclosure is used for manufacturing the photoluminescence device, in another preferable implementation mode, the surface of the substrate in the step S1 has a hydrophilic area and a hydrophobic area, the hollow portions are set corresponding to the hydrophilic area or the hydrophobic area; in the step S2, the hydrophobic ink enters the hydrophobic area through the hollow portions, or the hydrophilic ink enters the hydrophilic area through the hollow portions. The above hydrophilic area and hydrophobic area may form multiple separated sub-pixel areas on the surface of a light transmitting substrate, the hydrophilic quantum dot ink enters the hydrophilic area, and the hydrophobic area is used as a separating structure, or the hydrophobic quantum dot ink enters the hydrophobic area, and the hydrophilic area is used as the separating structure, so that the quantum dot ink color mixture between the different sub-pixel areas is effectively prevented, and the color accuracy is improved; in addition, compared with a manufacturing method for installing the pixel separating structure on a transparent substrate, the above preferable implementation mode is capable of enabling the ink to enter the needed sub-pixel area as well, and reducing the manufacturing cost of the photoluminescence device.

More preferably, the surface of the substrate forms multiple hydrophilic areas and multiple hydrophobic areas, and each hydrophilic area and each hydrophobic area are alternately arranged. The above preferable implementation mode may be used for forming multiple mutually separated sub-pixel areas on the surface on the light emitting substrate as well, the different colors of the quantum dot ink enters the different sub-pixel areas, so the above quantum dot may form a light emitting array under the irradiation of blue backlight, thereby the manufactured photoluminescence device realizes the all-color display of the RGB.

In the above preferable implementation mode, in order to make the hydrophilic ink or the hydrophobic ink more accurately enter the hydrophilic or hydrophobic sub-pixel areas of the substrate through the hollow portions of the mask plate, more preferably, the area of the hollow portions of the mask plate is less than or equal to the area of the corresponding hydrophilic area or the hydrophobic area; the shape of the hollow portions of the mask plate is the same as the shape of the corresponding hydrophilic area or the hydrophobic area.

The above preparation method for the substrate with the hydrophilic area and the hydrophobic area may include the following steps: step S001, the surface of the light transmitting substrate is provided with a raw material including a first reaction raw material; step S002, the first reaction raw material positioned in a first area is covered, and ultraviolet irradiation is performed on the first reaction raw material positioned in a second area, the first reaction raw material forms a second shielding area in the second area; step S003, the first reaction raw material in the first area is removed, the first area and the second shielding area are provided with a second reaction raw material; step S004, the second reaction raw material positioned in the second shielding area is covered, and the ultraviolet irradiation is performed on the second reaction raw material positioned in the first area, the second reaction raw material positioned forms a first shielding area in the first area, and the second reaction raw material on the second shielding area is removed, the first reaction raw material and the second reaction raw material are respectively selected from one of a hydrophilic reactant and a hydrophobic reactant, and the hydrophobicity-hydrophilicity of both parties are opposite, the first shielding area and the second shielding area correspond to a hydrophilic area and a hydrophobic area.

In the above preparation method for the substrate, the above raw material including the first reaction raw material may further include a solvent, a coupling agent and an initiator. At this moment, the above step S001 includes the following steps: A, the coupling agent and the initiator are mixed in the solvent, to form substrate treating liquid; B, the surface of at least one side of the substrate is placed in the substrate treating liquid, the coupling agent is bonding-fixed on the surface of the light transmitting substrate and a bonding surface is formed; and C, the first reaction raw material is set on the bonding surface. In the above step S002, through performing ultraviolet irradiation on the first reaction raw material positioned in the second area, a grafting reaction is performed on the first reaction raw material and the coupling agent under the ultraviolet irradiation, so the above second shielding area is formed; and in the above step S004, through performing the ultraviolet irradiation on the second reaction raw material positioned in the first area, the grafting reaction is performed on the second reaction raw material and the coupling agent under the ultraviolet irradiation, so the above first shielding area is formed.

In the above preparation method for the substrate, a process of removing the first reaction raw material in the first area may include the following steps: the first reaction raw material in the first area is washed by using a solvent, and the surface of the substrate is dried or solidified; in the same way, a process of removing the second reaction raw material in the second area may include the following steps: the second reaction raw material in the second shielding area is washed by using the solvent, and the surface of the substrate is dried or solidified. Those skilled in the art may set the technology conditions of the above washing technology and drying or solidifying treatment technology according to the prior art.

In order to perform the grafting reaction better between the first reaction raw material and the coupling agent and between the second reaction raw material and the coupling agent, preferably, a general formula of the above coupling agent is $(X_1\text{-}X_2\text{-}X_3\text{-})Si\text{-}Y$, where Y is a group with an ethenyl or an alkyl of which the tail end is provided with an SH group, $X_1$, $X_2$ and $X_3$ are respectively and independently selected from any one of Cl, $CH_3$, $OCH_3$, $OCH_2CH_3$ and $CH_2CH_3$, and the $X_1$, $X_2$ and X3 are not the alkyl at the same time; a general formula of the above first reaction raw material and second reaction raw material is A-B, where A is a group with a vinyl, at this moment, Y is the alkyl of which the tail end is provided with the SH group, or A is the alkyl of which the tail end is provided with the SH group, at this moment, Y is the group with the vinyl, B is a residue with a hydrophilic group, at this moment, the first reaction raw material or the second reaction raw material is a hydrophilic reactant, preferably the hydrophilic group is any one or more of a sulfonic acid group, an amidogen, a hydroxide radical, a carboxyl and an amino, or B is a residue with a hydrophobic group, at this moment, the first reaction raw material or the second reaction raw material is a hydrophobic reactant, preferably the hydrophilic group is any one or more of an alkyl, an ester group, a halogen and a nitryl.

The above manufacturing method of the disclosure may be used for manufacturing any one or more layers in the light emitting layer or the functional layer of the electroluminescence device, at this moment, the above substrate is a first electrode substrate, and while the light emitting layer is formed in the above step S3, preferably, after the step S3, the manufacturing method further includes the step S4: one side, away from the first electrode substrate, of the light emitting layer is provided with a second electrode. The above preferable implementation mode may be used for forming the electroluminescence device of which the structure is the first electrode substrate/light emitting layer/second electrode; while the functional layer is formed in the above step S3, preferably, after the step S3, the manufacturing method further includes the step S4: the functional layer is a first injection layer or a first transmission layer, one side, away from the first electrode substrate, of the first injection layer or the first transmission layer is provided with the light emitting layer, and one side, away from the first electrode substrate, of the light emitting layer is provided with the second electrode. The above preferable implementation mode may be used for forming the electroluminescence device with the functional layer.

In the above preferable implementation mode, while the functional layer formed in the step S3 is the first injection layer, more preferably, in the step S4, the manufacturing method further includes the following steps: before a process of installing the light emitting layer, the steps S1 to S3 are repeatedly performed, so a first transmission layer is set on the surface of the first injection layer; after the process of installing the light emitting layer, the steps S1 to S3 are repeatedly performed, so a second transmission layer is set on the surface of the light emitting layer; and after the process of installing the light emitting layer, the steps S1 to S3 are repeatedly performed, so an second injection layer is set on the surface of the second transmission layer. The above preferable implementation mode may be used for forming the electroluminescence device of which the structure is first electrode substrate/first injection layer/first transmission layer/light emitting layer/second transmission layer/second injection layer/second electrode.

In the above electroluminescence device, while the first electrode is a positive electrode, and the second electrode is a negative electrode, the first injection layer is a hole injection layer, the first transmission layer is a hole transmission layer, the second injection layer is an electron injection layer, and the second transmission layer is an electron transmission layer; and while the first electrode is the negative electrode, and the second electrode is the positive electrode, the first injection layer the electron injection layer, the first transmission layer is the electron transmission layer, the second injection layer is the hole injection layer, the second transmission layer is the hole transmission layer, so that an inversion electroluminescence device is formed.

It is to be noted that the preparation technology for each layer in the electroluminescence device is not limited to the above preferable implementation modes, those skilled in the art may prepare other layers of the electroluminescence device in combination with a conventional technology in the prior art.

According to another aspect of the application, a light emitting device prepared by the above manufacturing method is further provided, the light emitting device is an electroluminescence device or a photoluminescence device. Because the above electroluminescence device and/or the above photoluminescence device is prepared through the above manufacturing method, and according to the manufacturing method, the mask plate with multiple hollow portions is disposed on the substrate, and the ink is set on the surface of the substrate through the hollow portions by using the solution method, and the ink on the substrate surface is dried or solidified, so as to form a light emitting layer or a functional layer, so that the mask plate is used for preventing the ink from being dispersed to other color areas, a color mixture problem is effectively avoided, and the color precision of the light emitting device with the electroluminescence device and/or the photoluminescence device is improved.

According to yet another aspect of the application, a hybrid light emitting device is further provided, as shown in FIG. 8, the hybrid light emitting device includes an electroluminescence device 100 and a photoluminescence device 200 set on the light emitting side of the electroluminescence device 100, the electroluminescence device and/or the photoluminescence device is prepared by the above manufacturing method. Because the electroluminescence device and/or the photoluminescence device in the above hybrid light emitting device is prepared through the manufacturing method for the light emitting device, according to the manufacturing method, the mask plate with multiple hollow portions is disposed on the substrate, and the ink is set on the surface of the substrate through the hollow portions by using the solution method, and the ink on the substrate surface is dried or solidified, so as to form the light emitting layer or the functional layer, so that the mask plate is used for preventing the ink from being dispersed to other color areas, the color mixture problem is effectively avoided, and the color precision of the hybrid light emitting device with the electroluminescence device and/or the photoluminescence device is improved.

Figure 2:
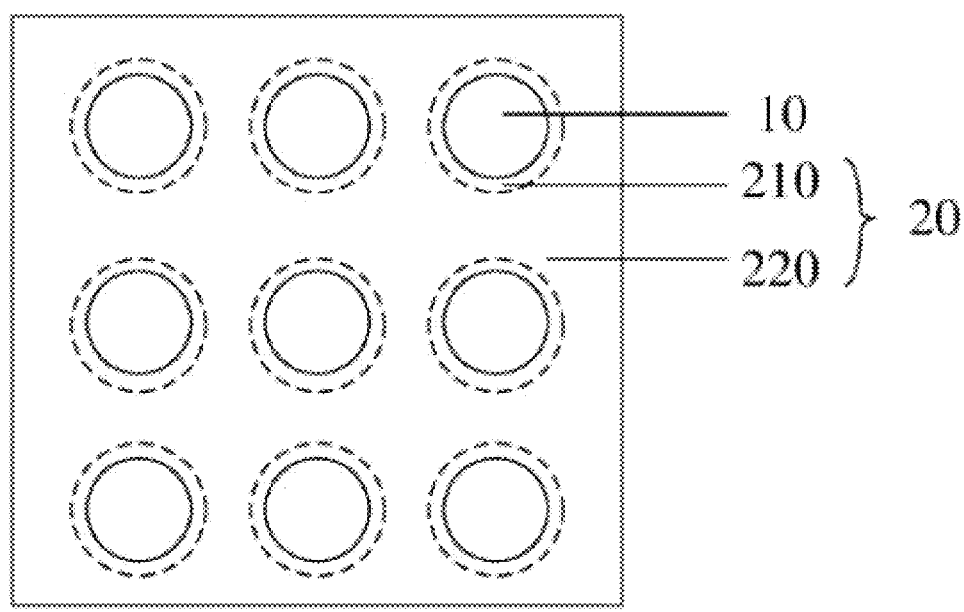
FIG. 2 shows a top view structure schematic diagram of a surface modified mask plate provided by an embodiment of the disclosure.

According to another aspect of the application, another surface modified mask plate is further provided, as shown in FIG. 2, the surface modified mask plate is provided with multiple hollow portions 10, the surface modified mask plate is provided with a modified surface 20, the modified surface 20 includes a first modified surface 210 and a second modified surface 220, the first modified surface 210 is set around the hollow portions 10, the modified surface 20 except the first modified surface 210 is the second modified surface 220, and the first modified surface 210 and the second modified surface 220 are respectively a hydrophilic surface and a hydrophobic surface.

Because the surface modified mask plate is provided with the modified surface, the modified surface includes the first modified surface and the second modified surface, the first modified surface is set around the hollow portions, the modified surface except the first modified surface is the second modified surface, and the first modified surface and the second modified surface are respectively the hydrophilic surface and the hydrophobic surface, while the above surface modified mask plate is used for preparing a light emitting device, the hydrophilic or hydrophobic ink enters the corresponding sub-pixel area through the hollow portions surrounded by the hydrophobic surface, or the hydrophilic ink enters the corresponding sub-pixel area through the hollow portions surrounded by the hydrophilic surface, and may not be adhered to the surface modified mask plate, the guidance quality of a material is improved by using the mask plate, thereby the spray-coating technology in the solution method may be used for manufacturing the pixel, and an inkjet printing device in lower precision may be used for manufacturing the pixel, the needed cost of using a precision inkjet printing device is reduced finally.

According to another aspect of the application, a surface modifying method for a mask plate is further provided, the obtained surface modified mask plate is as shown in FIG. 2, the surface modifying method includes the following steps: the surface of the mask plate with multiple hollow portions 10 is provided with a modified surface 20, the modified surface 20 includes a first modified surface 210 and a second modified surface 220, the first modified surface 210 is set around the hollow portions 10, the modified surface 20 except the first modified surface 210 is the second modified surface 220, and the first modified surface 210 and the second modified surface 220 are respectively a hydrophilic surface and a hydrophobic surface.

In the above surface modifying method for the mask plate, because the surface of the mask plate is provided with the modified surface, the modified surface includes the first modified surface 210 and the second modified surface 220, the first modified surface is set around the hollow portions 10, the modified surface except the first modified surface 210 is the second modified surface 220, and the first modified surface 210 and the second modified surface 220 are respectively the hydrophilic surface and the hydrophobic surface, so while the above surface modified mask plate is used for preparing a quantum dot film layer, the hydrophobic ink enters the corresponding sub-pixel area through the hollow portions 10 surrounded by the hydrophobic surface, or the hydrophilic ink enters the corresponding sub-pixel area through the hollow portions surrounded by the hydrophilic surface, and may not be adhered to the surface modified mask plate, the unbalanced ink quantity of entering each sub-pixel area because the ink is adhered to the mask plate is effectively prevented, thereby a problem that the color accuracy is reduced because of the unbalanced ink quantity in each sub-pixel area is effectively prevented.

The above mask plate is made of a metal material generally, because an oxidation layer on the metal surface is affiliative with water, so the surfaces of most of metals are hydrophilic, the preferable material herein is a hydrophilic metal material or other hydrophilic anti-ultraviolet anti-aging material. In a preferable implementation mode, the above step of installing the modified surface 20 on the surface of the mask plate includes the following steps: step S01', the mask plate is immerged in solution with a hydrophobic material, so that the hydrophobic material is fixed on the surface of the mask plate, preferably the hydrophobic material is a fluoric silane coupling agent; and step S02', the mask plate fixed with the hydrophobic material is separated from the solution, and drying treatment or solidifying treatment is performed on the mask plate; and step S03', a first photomask is set on the first surface of the mask plate, the first photomask is formed by multiple first shielding portions and a first light transmitting portion connected to each first shielding portion, the first shielding portions correspond to the hollow portions 10 one by one, and the area of each first shielding portion is greater than the area of each hollow portion 10 corresponding to the first shielding portion, ultraviolet ozone photolysis oxidization is performed on the first surface of the mask plate through the first photomask, and the ultraviolet ozone photolysis oxidization is performed on the second surface, opposite to the first surface, of the mask plate, so as to form a second modified surface 220 with hydrophilicity, the rest surface of the mask plate forms a first modified surface 210 with hydrophobicity; or a second photomask is set on the mask plate, the second photomask is formed by multiple second light transmitting portions and a second shielding portion connected to each second light transmitting portion, and the second light transmitting portions correspond to the hollow portions 10 one by one, and the area of each second light transmitting portion is greater than the area of each hollow portion 10 corresponding to the second light transmitting portion, the ultraviolet ozone photolysis oxidization is performed on the mask plate, so that the surface, corresponding to the second light transmitting portions, of the mask plate forms the first modified surface 210 with the hydrophilicity, and the rest surface of the mask plate forms the second modified surface 220 with the hydrophobicity.

In the above step of installing the modified surface 20, in order to make the prepared surface modified mask plate has the better hydrophobicity, preferably the hydrophobic material is a fluoric silane coupling agent. Through performing the ultraviolet ozone photolysis oxidization on the hydrophobic material, the hydrophobic fluoric silane coupling agent is used for removing and exposing the hydrophilic metal surface, technology conditions of the above ultraviolet ozone photolysis oxidization may be set by those skilled in the art according to the convenient art.

Figure 3:
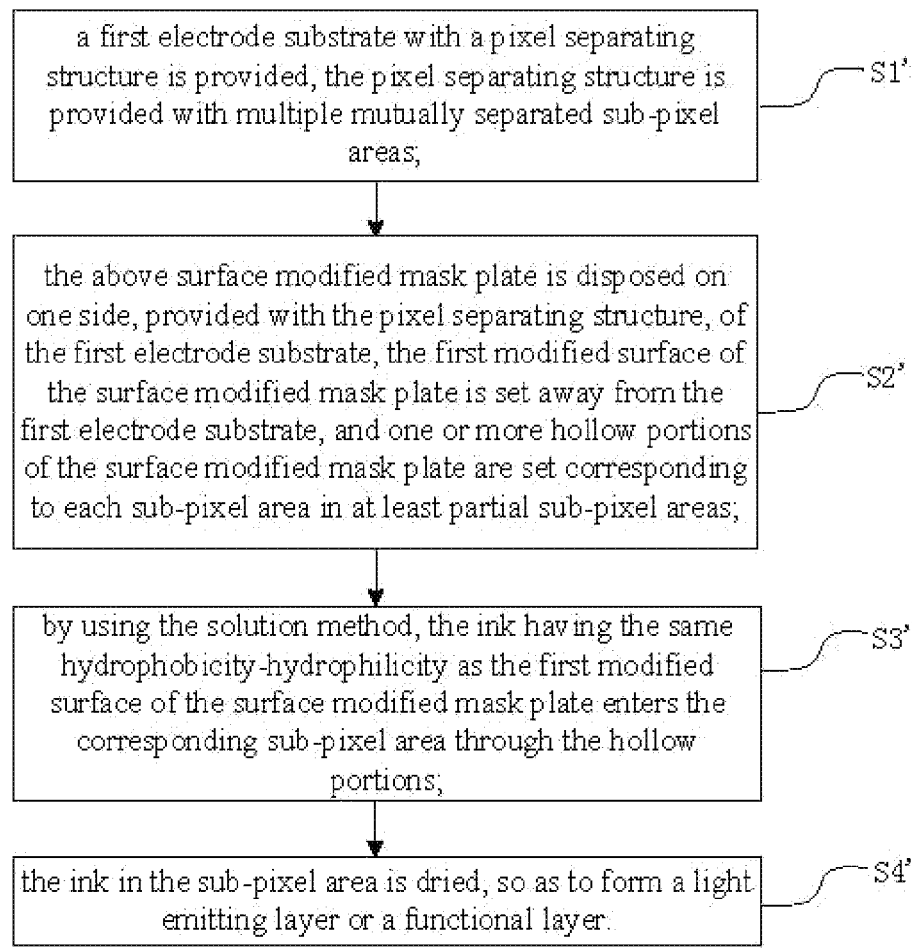
FIG. 3 shows a flow schematic diagram of a manufacturing method of an electroluminescence device provided by an embodiment of the disclosure.

According to another aspect of the application, a manufacturing method for an electroluminescence device is further provided, as shown in FIG. 3, the manufacturing method includes the following steps: step S1', a first electrode substrate with a pixel separating structure is provided, the pixel separating structure is provided with multiple mutually separated sub-pixel areas; step S2', the above surface modified mask plate is disposed on one side, provided with the pixel separating structure, of the first electrode substrate, the first modified surface of the surface modified mask plate is set away from the first electrode substrate, and one or more hollow portions of the surface modified mask plate are set corresponding to each sub-pixel area in at least partial sub-pixel areas; step S3', by using the solution method, the ink having the same hydrophobicity-hydrophilicity as the first modified surface of the surface modified mask plate enters the corresponding sub-pixel area through the hollow portions; and step S4', the ink in the sub-pixel area is dried or solidified, so as to form a light emitting layer or a functional layer.

According to another aspect of the application, a manufacturing method for an electroluminescence device is further provided, the manufacturing method includes the following steps: step S1', a first electrode substrate with a pixel separating structure is provided, the pixel separating structure is provided with multiple mutually separated sub-pixel areas; step S2', the above surface modified mask plate is disposed on one side, provided with the pixel separating structure, of the first electrode substrate, the first modified surface of the surface modified mask plate is set away from the first electrode substrate, and one or more hollow portions of the surface modified mask plate are set corresponding to each sub-pixel area in at least partial sub-pixel areas; step S3', by using the solution method, the ink having the same hydrophobicity-hydrophilicity as the first modified surface of the surface modified mask plate enters the corresponding sub-pixel area through the hollow portions; and step S4', the ink in the sub-pixel area is dried or solidified, so as to form a light emitting layer or a functional layer.

In the manufacturing method of the disclosure, because the first electrode substrate with the pixel separating structure is provided, the pixel separating structure is provided with multiple mutually separated sub-pixel areas, the modified mask plate is set on one side, provided with the pixel separating structure, of the first electrode substrate, the above surface modified mask plate is provided with the modified surface, the modified surface includes the first modified surface and the second modified surface, the first modified surface is set around the hollow portions, the modified surface except the first modified surface is the second modified surface, and the first modified surface and the second modified surface are respectively the hydrophilic surface and the hydrophobic surface, so the guidance quality of the material is improved through the combination of the above pixel separating structure and the mask plate, thereby the spray-coating technology in the solution method may be used for manufacturing the pixel, and an inkjet printing device in lower precision may be used for manufacturing the pixel, the needed cost of using a precision inkjet printing device is reduced finally.

The above surface modified mask plate is as shown in FIG. 2, exemplary implementation modes of the manufacturing method for the electroluminescence device provided according to the disclosure is described in more detail below in combination with FIG. 2. However, these exemplary implementation modes may be implemented in multiple different modes, and are not ought to be explained to be only limited to the implementation modes described herein. It is to be understood that these implementation modes are provided for completely and integrally disclosing the application, and the conception of these implementation modes are adequately delivered to those of ordinary skill in the art.

Firstly, the step S1' is executed: the first electrode substrate with the pixel separating structure is provided, the pixel separating structure is provided with multiple mutually separated sub-pixel areas. The above pixel separating structure is used for preventing the ink color mixture between the different sub-pixel areas. More preferably, the naked surface of the pixel separating structure includes the hydrophilic surface or the hydrophobic surface. Through enabling the surface of the above pixel separating structure and the ink to have the different hydrophobicity-hydrophilicity, in the step of forming a light emitting layer or a functional layer, the ink may not be reserved on the upper surface or the side wall of the pixel separating structure, and flowed back to the pixel area under the effect of gravity, so the color mixture between the neighboring pixel areas is effectively prevented, and the color accuracy is improved.

After the step S1' is executed, the S2' is executed: the above surface modified mask plate is disposed on one side, provided with the pixel separating structure, of the first electrode substrate, the modified surface 20 of the surface modified mask plate is positioned at one side, away from the first electrode substrate, of the surface modified mask plate, and one or more hollow portions of the surface modified mask plate are set corresponding to each sub-pixel area in at least partial sub-pixel areas. In order to reduce the effect of the color accuracy because the mask plate is deformed while the light emitting device is prepared in large area so that a quantity or a position of the ink falling into the corresponding sub-pixel area produces a deviation, the above mask plate may contact with the surface of one side, provided with the pixel separating structure, of the substrate; in addition, in order to make the hydrophilic ink or the hydrophobic ink more accurately enter the sub-pixel area of the pixel separating structure through the hollow portions of the mask plate, preferably, the area of the above hollow portions is less than or equal to the area of the corresponding sub-pixel area, more preferably, the shape of the hollow portions is the same as the shape of the corresponding sub-pixel area.

After the step S2' is executed, the step S3' is executed: by using the solution method, the ink having the same hydrophobicity-hydrophilicity as the first modified surface 210 of the surface modified mask plate enters the corresponding sub-pixel area through the hollow portions. Because the surface modified mask plate is used, the above solution method may by a spray-coating technology or a low-precision inkjet printing technology, thereby the spray-coating technology or the inkjet printing technology is used for enabling the hydrophilic ink or the hydrophobic ink to enter the sub-pixel area through the hollow portions. Preferably the viscosity of the above hydrophilic ink or the hydrophobic ink is less than or equal to 50 cps, so the ink supply may be controlled well by a device nozzle; and in order to guarantee that the ink may be effectively atomized by the nozzle, preferably, the above spray-coating technology is ultrasonic spray-coating, in order to improve the spray-coating effect of the preferable hydrophilic ink or the hydrophobic ink, an ultrasonic frequency used by the preferable ultrasonic spray-coating is 45-180 kHz, the viscosity of the preferable hydrophilic ink or hydrophobic ink is less than or equal to 10 cps.

The above ink may be any one of a hole injection material ink, a hole transmission material ink, an electron injection material ink and an electron transmission layer material ink, or may be any one of quantum dot material ink and organic light emitting material ink, through enabling the different types of the ink to enter the corresponding sub-pixel area, a light emitting layer or the different types of functional layers are formed in the subsequent step S4'; in addition, the ink includes the hydrophilic ink and the hydrophobic ink, while the hydrophilic ink or the hydrophobic ink is the quantum dot material ink, the above hydrophilic ink includes a hydrophilic quantum dot, and the hydrophilic quantum dot is a quantum dot of which a surface ligand contains a hydrophilic group, preferably the hydrophilic group is a carboxyl, an amidogen, a hydroxyl or a sulfydryl; while the above quantum dot material ink is the hydrophobic ink, the above hydrophobic ink includes a hydrophobic quantum dot, and the hydrophobic quantum dot is a quantum dot of which a surface ligand contains a hydrophobic group, preferably the hydrophobic group is a hydrocarbon chain or an ester group. In order that the electroluminescence device can emit light of different colors, preferably the above hydrophilic quantum dot and the above hydrophobic quantum dot are independently selected from any one of a red quantum dot, a blue quantum dot and a green quantum dot.

While the naked surface of the pixel separating structure in the above step S1' is the hydrophilic surface, in the step S3', in the step of enabling the hydrophobic ink to enter the sub-pixel area through the hollow portion; and while the naked surface of the pixel separating structure is the hydrophobic surface, in the step S3', in the step of enabling the hydrophilic ink to enter the sub-pixel area through the hollow portions, the above pixel separating structure with the hydrophilic-hydrophobic naked surface is capable of enabling the hydrophilic ink or the hydrophobic ink to be flowed back to the pixel area under the effect of gravity, and not be reserved on the upper surface or the side wall of the pixel separating structure, thereby the color mixture between the neighboring pixel area is effectively prevented.

After the step S3' is executed, the S4' is executed: the ink in the sub-pixel area is dried or solidified, so as to form a light emitting layer or a functional layer. The above ink drying technology conditions may be set by those skilled in the art according to the prior art; in addition, while the above ink is the hole injection material ink, the hole transmission material ink, the electron injection material ink or the electron transmission layer material ink, in the step S4', the ink is dried or solidified, so as to form the corresponding hole injection layer, the hole transmission layer, the electron injection layer or the electron transmission layer; and while the above ink the quantum dot material ink or the organic light emitting material ink, in the step S4', the ink is dried or solidified, so as to form the corresponding quantum dot light emitting layer or the organic light emitting layer.

While the above ink in the quantum dot material ink, in a preferable implementation mode, the manufacturing further includes a process of at least one time of repeatedly performing the step S2' to the step S4', in each time of the repeated process, the hollow portions of the used surface modified mask plate correspond to the different sub-pixel areas, the light emitting colors of the used ink are different, the ink light emitting colors of the different sub-pixel areas are different each other, the used quantum dot ink may be the hydrophilic ink or the hydrophobic ink, in the above preferable implementation mode, through installing the different light emitting colors of the hydrophilic ink or the hydrophobic ink in each sub-pixel area and drying or solidifying, so that the all-color display of the electroluminescence device is realized; in addition, through respectively installing the red quantum dot, the blue quantum dot and the green quantum dot in the different sub-pixel areas, the electroluminescence device may achieve the wider display color gamut.

While the light emitting layer is formed in the step S4', preferably, after the step S4', the manufacturing further includes a step S5': one side, away from the first electrode substrate, of the light emitting layer is provided with a second electrode. The above preferable implementation mode may be used for forming the electroluminescence device of which the structure is the first electrode substrate/light emitting layer/second electrode; while the functional layer is formed in the above step S4', preferably, after the step S4', the manufacturing method further includes the step S5': while the functional layer is formed in the step S4', the functional layer is a first injection layer or a first transmission layer, one side, away from the first electrode substrate, of the first injection layer or the first transmission layer is provided with the light emitting layer, and one side, away from the first electrode substrate, of the light emitting layer is provided with the second electrode. The above preferable implementation mode may be used for forming the electroluminescence device with the functional layer.

While the functional layer formed in the S4' is the first injection layer, in a preferable implementation mode, in the step S5', the manufacturing method further includes the following steps: before a process of installing the light emitting layer, the steps S2' to S4' are repeatedly performed, so a first transmission layer is set on the surface of the first injection layer; after the process of installing the light emitting layer, the steps S2' to S4' are repeatedly performed, a second transmission layer is set on the surface of the light emitting layer; and after the process of installing the light emitting layer, the steps S2' to S4' are repeatedly performed, a second injection layer is set on the second transmission layer. The above preferable implementation mode may be used for forming the electroluminescence device of which the structure is first electrode substrate/first injection layer/first transmission layer/light emitting layer/second transmission layer/second injection layer/second electrode. In the above electroluminescence device, while the first electrode is a positive electrode, and the second electrode is a negative electrode, the first injection layer is a hole injection layer, the first transmission layer is a hole transmission layer, the second injection layer is an electron injection layer, and the second transmission layer is an electron transmission layer; and while the first electrode is the negative electrode, and the second electrode is the positive electrode, the first injection layer the electron injection layer, the first transmission layer is the electron transmission layer, the second injection layer is the hole injection layer, the second transmission layer is the hole transmission layer, so that an inversion electroluminescence device is formed.

It is to be noted that the preparation technology for each layer in the electroluminescence device is not limited to the above preferable implementation modes, the above manufacturing method of the disclosure may be used for manufacturing any one or more layers in the light emitting layer or the functional layer of the electroluminescence device, and other layers of the electroluminescence device may be prepared by those skilled in the art in combination with a conventional technology in the prior art.

According to another aspect of the disclosure, a manufacturing method for a quantum dot film is further provided, as shown in FIG. 5, the manufacturing method for the quantum dot film includes the following steps: step A, a hydrophilic area and a hydrophobic area are formed on a first surface of a light transmitting substrate; step b, the surface modified mask plate with multiple hollow portions are set on the first surface of the light transmitting substrate, and the hollow portions in the surface modified mask plate are set corresponding to the hydrophilic area or the hydrophobic area, the surface modified mask plate is provided with a modified surface, the modified surface includes a first modified surface and a second modified surface, the first modified surface is set around the hollow portions, the modified surface except the first modified surface is the second modified surface, and the first modified surface and the second modified surface are different and are respectively selected from one of a hydrophilic surface and a hydrophobic surface, and the first modified surface is positioned at one side, away from the first surface of the light transmitting substrate, of the surface modified mask plate; step c, the first modified surface is the hydrophobic surface, so the hydrophobic quantum dot ink enters the hydrophobic area through the hollow portions, or the first modified surface is the hydrophilic surface, so the hydrophilic quantum dot ink enters the hydrophilic area through the hollow portions; and step d, the quantum dot ink in the hydrophilic area or the hydrophobic area is dried.

The above light transmitting substrate may transmit light of which a wavelength is between 400 nm and 700 nm, a whole light transmittance of the light transmitting substrate is more than 50%, and the preferable light transmittance is more than 90%.

According to another aspect of the disclosure, a manufacturing method for a quantum dot film is further provided, the manufacturing method for the quantum dot film includes the following steps: step a, a hydrophilic area and a hydrophobic area are formed on a first surface of a light transmitting substrate; step b, the surface modified mask plate with multiple hollow portions are set on the first surface of the light transmitting substrate, and the hollow portions in the surface modified mask plate are set corresponding to the hydrophilic area or the hydrophobic area, the surface modified mask plate is provided with a modified surface, the modified surface includes a first modified surface and a second modified surface, the first modified surface is set around the hollow portions, the modified surface except the first modified surface is the second modified surface, and the first modified surface and the second modified surface are different and are respectively selected from one of a hydrophilic surface and a hydrophobic surface, and the first modified surface is positioned at one side, away from the first surface of the light transmitting substrate, of the surface modified mask plate; step c, the first modified surface is the hydrophobic surface, so the hydrophobic quantum dot material ink enters the hydrophobic area through the hollow portions, or the first modified surface is the hydrophilic surface, the hydrophilic quantum dot material ink enters the hydrophilic area through the hollow portions; and step d, the quantum dot material ink in the hydrophilic area or the hydrophobic area is solidified.

In the above manufacturing method for the quantum dot film of the disclosure, because the hydrophilic area and the hydrophobic area are formed on the first surface of the light transmitting substrate, and the surface modified mask plate is set on the first surface of the light transmitting substrate, the hollow portions are set corresponding to the hydrophilic area or the hydrophobic area, the different quantum dot ink enters the different pixel areas through the surface modified mask plate, and multiple separated sub-pixel areas are formed on the surface of the light transmitting substrate through the hydrophilic area and the hydrophobic area on the light transmitting substrate, the hydrophilic quantum dot ink is enabled to enter the hydrophilic area, the hydrophobic area is used as a separating structure, or the hydrophobic quantum dot ink enters the hydrophobic area, and the hydrophilic area is used as the separating structure, so that the quantum dot ink color mixture between the different sub-pixel areas is effectively prevented, thereby a problem that the color accuracy is reduced because of the quantum dot ink color mixture in the different sub-pixel areas is effectively solved; in addition, compared with a manufacturing method for installing the pixel separating structure on a transparent substrate, the above manufacturing method of the application is capable of enabling the ink to enter the needed sub-pixel area as well, and reducing the manufacturing cost of the photoluminescence device.

Exemplary implementation modes of the manufacturing method for the quantum dot film provided according to the disclosure is described in more detail below, however, these exemplary implementation modes may be implemented in multiple different modes, and are not ought to be explained to be only limited to the implementation modes described herein. It is to be understood that these implementation modes are provided for completely and integrally disclosing the application, and the conception of these implementation modes are adequately delivered to those of ordinary skill in the art.

Firstly, the step a is executed: the hydrophilic area and the hydrophobic area are formed on the first surface of the light transmitting substrate. In a preferable implementation mode, first surface forms multiple hydrophilic areas and multiple hydrophobic areas, and each hydrophilic area and each hydrophobic area are alternately arranged. The above preferable implementation mode may be used for forming multiple mutually separated sub-pixel areas on the first surface of the light transmitting substrate, so the different colors of the quantum dot ink enters the different sub-pixel areas, and a film with the quantum dot may form a light emitting array under the irradiation of blue backlight, thereby the prepared quantum dot color film realizes the all-color display of the RGB.

In a preferable implementation mode, the step a includes the following steps: step S001, the surface of the light transmitting substrate is provided with a raw material including a first reaction raw material; step S002, the first reaction raw material positioned in a first area is covered, and ultraviolet irradiation is performed on the first reaction raw material positioned in a second area, the first reaction raw material forms a second shielding area in the second area; step S003, the first reaction raw material in the first area is removed, the first area and the second shielding area are provided with a second reaction raw material; step S004, the second reaction raw material positioned in the second shielding area is covered, and the ultraviolet irradiation is performed on the second reaction raw material positioned in the first area, the second reaction raw material positioned forms a first shielding area in the first area, and the second reaction raw material on the second shielding area is removed, the first reaction raw material and the second reaction raw material are respectively selected from one of a hydrophilic reactant and a hydrophobic reactant, and the hydrophobicity-hydrophilicity of both parties are opposite, the first shielding area and the second shielding area correspond to a hydrophilic area and a hydrophobic area.

In the above preferable implementation mode, the above raw material including the first reaction raw material may further include a solvent, a coupling agent and an initiator. At this moment, the above step S001 includes the following steps: A, the coupling agent and the initiator are mixed in the solvent, to form substrate treating liquid; B, the surface of at least one side of the substrate is placed in the substrate treating liquid, the coupling agent is bonding-fixed on the surface of the light transmitting substrate and a bonding surface is formed; and C, the first reaction raw material is set on the bonding surface. In the above step S002, through performing ultraviolet irradiation on the first reaction raw material positioned in the second area, a grafting reaction is performed on the first reaction raw material and the coupling agent under the ultraviolet irradiation, so the above second shielding area is formed; and in the above step S004, through performing the ultraviolet irradiation on the second reaction raw material positioned in the first area, the grafting reaction is performed on the second reaction raw material and the coupling agent under the ultraviolet irradiation, so the above first shielding area is formed.

In the above preferable implementation mode, a process of removing the first reaction raw material in the first area may include the following steps: the first reaction raw material in the first area is washed by using a solvent, and the surface of the substrate is dried or solidified; in the same way, a process of removing the second reaction raw material in the second area may include the following steps: the second reaction raw material in the second shielding area is washed by using the solvent, and the surface of the substrate is dried or solidified. Those skilled in the art may set the technology conditions of the above washing technology and drying or solidifying treatment technology according to the prior art.

In order to perform the grafting reaction better between the first reaction raw material and the coupling agent and between the second reaction raw material and the coupling agent, preferably, a general formula of the above coupling agent is $(X_1\text{-}X_2\text{-}X_3\text{-})Si\text{-}Y$, where Y is a group with an ethenyl or an alkyl of which the tail end is provided with an SH group, $X_1$, $X_2$ and $X_3$ are respectively and independently selected from any one of Cl, $CH_3$, $OCH_3$, $OCH_2CH_3$ and $CH_2CH_3$, and the $X_1$, $X_2$ and $X_3$ are not the alkyl at the same time; a general formula of the above first reaction raw material and second reaction raw material is A-B, where A is a group with a vinyl, at this moment, Y is the alkyl of which the tail end is provided with the SH group, or A is the alkyl of which the tail end is provided with the SH group, at this moment, Y is the group with the vinyl, B is a residue with a hydrophilic group, at this moment, the first reaction raw material or the second reaction raw material is a hydrophilic reactant, preferably the hydrophilic group is any one or more of a sulfonic acid group, an amidogen, a hydroxide radical, a carboxyl and an amino, or B is a residue with a hydrophobic group, at this moment, the first reaction raw material or the second reaction raw material is a hydrophobic reactant, preferably the hydrophilic group is any one or more of an alkyl, an ester group, a halogen and a nitryl.

After the step a is executed, the step b is executed: the above surface modified mask plate is set on the first surface of the light transmitting substrate, and the hollow portions 10 in the surface modified mask plate are set corresponding to the hydrophilic area or the hydrophobic area, the surface modified mask plate is provided with a modified surface 20, the modified surface 20 includes a first modified surface 210 and a second modified surface 220, the first modified surface 210 is set around the hollow portions 10, the modified surface 20 except the first modified surface 210 is the second modified surface 220, and the first modified surface 210 and the second modified surface 220 have the hydrophobicity-hydrophilicity respectively, the above surface modified mask plate is as shown in FIG. 2. In order to make the hydrophilic ink or the hydrophobic ink more accurately enter the light transmitting substrate through the hollow portions 10 of the surface modified mask plate in the subsequent step c, preferably, the area of the hollow portions 10 in the surface modified mask plate is less than or equal to the area of the corresponding hydrophilic area or the hydrophobic area, more preferably, the shape of the hollow portions 10 is the same as the shape of the corresponding hydrophilic area or the hydrophobic area.

In a preferable implementation mode, the above manufacturing method further includes a process of preparing the above surface modified mask plate: step S01, the mask plate is immerged in solution with a hydrophobic material, so that the hydrophobic material is fixed on the surface of the mask plate, preferably the hydrophobic material is a fluoric silane coupling agent; and step S02, the mask plate fixed with the hydrophobic material is separated from the solution, and drying treatment is performed on the mask plate, and drying treatment or solidifying treatment is performed on the mask plate; and S03, a first photomask is set on the first surface of the mask plate, the first photomask is formed by multiple first shielding portions and a first light transmitting portion connected to each first shielding portion, the first shielding portions correspond to the hollow portions 10 one by one, and the area of each first shielding portion is greater than the area of each hollow portion 10 corresponding to the first shielding portion, ultraviolet ozone photolysis oxidization is performed on the first surface of the mask plate through the first photomask, and the ultraviolet ozone photolysis oxidization is performed on the second surface, opposite to the first surface, of the mask plate, so as to form a second modified surface 220 with hydrophilicity, the rest surface of the mask plate forms a first modified surface 210 with hydrophobicity; or a second photomask is set on the mask plate, the second photomask is formed by multiple second light transmitting portions and a second shielding portion connected to each second light transmitting portion, and the second light transmitting portions correspond to the hollow portions 10 one by one, and the area of each second light transmitting portion is greater than the area of each hollow portion 10 corresponding to the second light transmitting portion, the ultraviolet ozone photolysis oxidization is performed on the mask plate, so that the surface, corresponding to the second light transmitting portions, of the mask plate forms the first modified surface 210 with the hydrophilicity, and the rest surface of the mask plate forms the second modified surface 220 with the hydrophobicity.

In another preferable implementation mode, the above manufacturing method further includes a process of preparing the above surface modified mask plate: step S01, the mask plate is immerged in solution with a hydrophobic material, so that the hydrophobic material is fixed on the surface of the mask plate, preferably the hydrophobic material is a fluoric silane coupling agent; and step S02, the mask plate fixed with the hydrophobic material is separated from the solution, and drying treatment is performed on the mask plate, and drying treatment or solidifying treatment is performed on the mask plate; and S03, a first photomask is set on the first surface of the mask plate, the first photomask is formed by multiple first shielding portions and a first light transmitting portion connected to each first shielding portion, the first shielding portions correspond to the hollow portions 10 one by one, and the area of each first shielding portion is greater than the area of each hollow portion 10 corresponding to the first shielding portion, ultraviolet ozone photolysis oxidization is performed on the first surface of the mask plate through the first photomask, and the ultraviolet ozone photolysis oxidization is performed on the second surface, opposite to the first surface, of the mask plate, so as to form a second modified surface 220 with hydrophilicity, the rest surface of the mask plate forms a first modified surface 210 with hydrophobicity; or a second photomask is set on the mask plate, the second photomask is formed by multiple second light transmitting portions and a second shielding portion connected to each second light transmitting portion, and the second light transmitting portions correspond to the hollow portions 10 one by one, and the area of each second light transmitting portion is greater than the area of each hollow portion 10 corresponding to the second light transmitting portion, the ultraviolet ozone photolysis oxidization is performed on the mask plate, so that the surface, corresponding to the second light transmitting portions, of the mask plate forms the first modified surface 210 with the hydrophilicity, and the rest surface of the mask plate forms the second modified surface 220 with the hydrophobicity.

In the above step of preparing the surface modified mask plate, the mask plate is made of a metal material generally, because an oxidation layer on the metal surface is affiliative with water, so the surfaces of most of metals are hydrophilic, the preferable material herein is a hydrophilic metal material or other hydrophilic anti-ultraviolet anti-aging material; in addition, in order to make the prepared surface modified mask plate has the better hydrophobicity, preferably the hydrophobic material is a fluoric silane coupling agent. Through performing the ultraviolet ozone photolysis oxidization on the hydrophobic material, the hydrophobic fluoric silane coupling agent is used for removing and exposing the hydrophilic metal surface, technology conditions of the above ultraviolet ozone photolysis oxidization may be set by those skilled in the art according to the convenient art.

After the step b is executed, the step c is executed: the first modified surface 210 is the hydrophobic surface, so the hydrophobic quantum dot ink enters the hydrophobic area through the hollow portions 10, or the first modified surface 210 is the hydrophilic surface, the hydrophilic quantum dot ink enters the hydrophilic area through the hollow portions 10. A spray-coating technology or an inkjet printing technology may be used for enabling the quantum dot ink to enter the hydrophilic area or the hydrophobic area through the hollow portions 10, preferably the viscosity of the above quantum dot ink is less than or equal to 50 cps, so the quantum dot ink may be dispersed better and fall into the sub-pixel area; in addition, in order to guarantee that the ink may be effectively atomized by the nozzle, preferably, the above spray-coating technology is ultrasonic spray-coating, in order to improve the spray-coating effect of the preferable hydrophilic ink or the hydrophobic ink, an ultrasonic frequency used by the preferable ultrasonic spray-coating is 45-180 kHz, the viscosity of the preferable hydrophilic ink or hydrophobic ink is less than or equal to 10 cps.

The above hydrophilic ink includes a hydrophilic quantum dot, and the hydrophilic quantum dot is a quantum dot of which a surface ligand contains a hydrophilic group, preferably the hydrophilic group is a carboxyl, an amino, a hydroxyl or a sulfydryl; and the above hydrophobic ink includes a hydrophobic quantum dot, and the hydrophobic quantum dot is a quantum dot of which a surface ligand contains a hydrophobic group, preferably the hydrophobic group is a hydrocarbon chain or an ester group; in order to enable the electroluminescence and photoluminescence combined light emitting device to display in all colors, preferably the quantum dot in the above quantum dot ink is a red quantum dot and/or a green quantum dot.

The above quantum dot ink with the hydrophilicity and the hydrophobicity may also include a curable resin or a monomer thereof and a solvent (or named as a dispersing agent). The solvent may be selected from long chain hydrocarbon of which a boiling point is between 40 and 250 DEG C, a mixture of alcohol, ester and ether as an organic solvent. Preferably, the hydrocarbon is liner chain or branched chain alkane, for example, the hydrocarbon is C6-10 alkane. The organic solvent may be chlorobenzene, orthodichlorobenzene, tetrahydrofuran, anisole, morpholine, methylbenzene, ortho-xylene, m-xylene, p-xylene, alkylbenzene, nitrobenzene, normal hexane, cyclohexane, n-heptane, cycloheptane, dioxane, dichloromethane, trichloromethane, dichloroethane, chloroform, chlorobenzene, 1,4-dioxahexane, 1,2-dichloroethane, 1,1,1-trichloroethane, 1,1,2,2-tetrachloroethane, tetrahydronaphthalene, decalin, N,N-dimethylformamide, N,N-dimethylacetamide, dimethyl sulfoxide chloroform, tetrahydrofuran, dichloromethane, methylbenzene, normal hexane, methyl alcohol, ethyl alcohol, propyl alcohol, butyl alcohol, acetone, dioxane, dimethylformamide and dimethyl sulfoxide. The curable resin is selected from an epoxy resin, an acrylic resin, an organic silicon resin, or a curable resin crosslinking-formed by a corresponding monomer. The above hydrophilic and hydrophobic quantum dot ink may further include a cross-linking agent with a double-bond, a light curing agent or a heat curing agent and the like.

After the step c is executed, the step d is executed: the quantum dot ink in the hydrophilic area or the hydrophobic area is dried. Those skilled in the art may set the technology conditions of the above quantum dot ink drying technology according to the prior art. In a preferable implementation mode, the manufacturing method further includes a process of repeatedly performing at least one time of steps b to d, in each time of the repeated process, the hollow portions of the used surface modified mask plate correspond to the hydrophilic area or the hydrophobic area, and the light emitting colors of the used quantum dot ink are different. In the above preferable implementation mode, through installing the different light emitting colors of the quantum dot material ink on a target area of the substrate and drying or solidifying, the final light emitting color of the light emitting device is adjusted; and through installing the red quantum dot and the green quantum dot on the different sub-pixel areas, under the irradiation of blue backlight, the quantum dot film may realize the red and green photoluminescence, so all-color display of the RGB is realized.

According to another aspect of the application, a quantum dot film is further provided, the quantum dot film is manufactured by the above manufacturing method. Because the hydrophilic area and the hydrophobic area are formed on the first surface of the light transmitting substrate, and the surface modified mask plate is set on the first surface of the light transmitting substrate, the hollow portions are set corresponding to the hydrophilic area or the hydrophobic area, the different quantum dot ink enters the different pixel areas through the surface modified mask plate, and multiple separated sub-pixel areas are formed on the surface of the light transmitting substrate through the hydrophilic area and the hydrophobic area on the light transmitting substrate, the hydrophilic quantum dot ink is enabled to enter the hydrophilic area, the hydrophobic area is used as a separating structure, or the hydrophobic quantum dot ink enters the hydrophobic area, and the hydrophilic area is used as the separating structure, so that the quantum dot ink color mixture between the different sub-pixel areas is effectively prevented; in addition, compared with the quantum dot film formed by installing the pixel separating structure on the transparent substrate, the above quantum dot film has the lower manufacturing cost.

According to another aspect of the application, a display device is further provided, the display device includes an electroluminescence device and the above quantum dot film set on the light emitting side of the electroluminescence device. Because the quantum dot film is in the above display device is formed through forming the hydrophilic area and the hydrophobic area on the first surface of the light transmitting substrate, and installing the above surface modified mask plate on the first surface of the light transmitting substrate, and enabling the hollow portions to be set corresponding to the hydrophilic area or the hydrophobic area, the quantum dot color mixture between the different pixel areas in the quantum dot film is prevented, and the color accuracy of the display device with the quantum dot film is effectively improved.

In order to prevent the color mixture between the neighboring sub-pixel areas in the quantum dot film while the quantum dot film is irradiated by the electroluminescence device, preferably, the second modified surface, opposite to the first modified surface, of the light transmitting substrate in the quantum dot film or the blue backlight emitting side adhered to the second modified surface is provided with a black matrix, while the hydrophilic quantum dot ink enters the hydrophilic area, the black matrix is set corresponding to the hydrophobic area, and while the hydrophobic quantum dot ink enters the hydrophobic area, the black matrix is set corresponding to the hydrophilic area.

The light emitting device and the manufacturing method thereof provided by the disclosure are further described below in combination with embodiments.

Embodiment 1

A manufacturing method for a surface modified mask plate provided by the embodiment includes the following steps:

step S101, the mask plate prepared by nickel alloy is immerged in solution with a hydrophobic material, the above hydrophobic material is heptadecafluorodecyl trimethoxy silane, so that the hydrophobic material is fixed on the surface of the mask plate;

step S102, the mask plate fixed with the hydrophobic material is separated from the solution, and the mask plate is dried or solidified to obtain the surface modified mask plate with the hydrophobicity.

Embodiment 2

A manufacturing method for a substrate with a hydrophilic area and a hydrophobic area on a surface includes the following steps:

the coupling agent and the initiator are mixed in the solvent, to form substrate treating liquid, the surface of one side of the light transmitting substrate is placed in the substrate treating liquid, the coupling agent is bonding-fixed on the surface of the light transmitting substrate and a bonding surface is formed, the first reaction raw material is set on the bonding surface, the first reaction raw material positioned in the first area is covered, and ultraviolet irradiation is performed on the first reaction raw material positioned in the first area, so that a grafting reaction is performed on the first reaction raw material and the coupling agent under the ultraviolet irradiation, so the hydrophobic area is formed, the first reaction raw material in the first area is removed, and a second reaction raw material is set on the first area and the second shielding area, the second reaction raw material positioned in the second shielding area is covered, and the ultraviolet irradiation is performed on the second reaction raw material positioned in the first area, so the grafting reaction is performed on the second reaction raw material and the coupling agent under the ultraviolet irradiation, so the hydrophilic area is formed, and the surface modified mask plate is obtained;

herein, the light transmitting substrate is glass, the coupling agent is chloro-(dimethyl)-vinylsilane, the initiator is 4-dimethylpyridine, the first reaction raw material is 1H,1H, 2H,2H-perfluorodecyl mercaptan, the second reaction raw material is mercaptoethylamine, and the hydrophobic second area corresponds to two groups of 96×64 micro-array patterns.

Embodiment 3

A manufacturing method for an electroluminescence device provided by the embodiment includes the following steps:

step S301, a first electrode substrate with a pixel separating structure is provided, the pixel separating structure has 96×64 mutually separated sub-pixel areas, the first electrode substrate is a substrate with a positive electrode layer, and the positive electrode layer is an ITO positive electrode;

step S302, the surface modified mask plate provided in the embodiment 1 is set on one side, with the pixel separating structure, of the first electrode substrate, hollow portions of the mask plate correspond to the sub-pixel areas;

step S303, an inkjet printing (the type is Dimatix Materials Printer DMP-2831) technology is used for enabling water solution of PEDOT:PSS as hole injection layer ink to enter the corresponding sub-pixel area through the hollow portions;

step S304, the hole injection layer ink in the sub-pixel area is dried or solidified, so as to form a hole injection layer;

step S305, the steps of S302 to S304 are executed again, in the step S302 of the above repeated process, the mask plate prepared by the nickel alloy is used, in the step S303 of the above repeated process, hole transmission layer ink is used, and the hole transmission layer ink is toluene solution of poly-(9-vinyl) carbazole (PVK), so a hole transmission layer is formed in the step S304;

step S306, the steps of S302 to S304 are executed again, in the step S302 of the above repeated process, the mask plate prepared by the nickel alloy is used, in the step S303 of the above repeated process, green quantum dot material ink is used, and the green quantum dot material ink is decane solution of CdSe/CdS, so a green quantum dot light emitting area is formed in the step S304;

step S307, the steps of S302 to S304 are executed again, in the step S302 of the above repeated process, the mask plate prepared by the nickel alloy is used, in the step S303 of the above repeated process, red quantum dot material ink is used, and the red quantum dot material ink is decane solution of CdSe/ZdS, so a red quantum dot light emitting area is formed in the step S304;

step S308, the steps of S302 to S304 are executed again, in the step S302 of the above repeated process, the surface modified mask plate provided in the embodiment 1 is used, electron transmission layer ink and electron injection layer ink are used in the step S303 of the above repeated process, and the electron transmission layer ink and the electron injection layer ink are butyl alcohol solution of ZnO, electron transmission and injection layers are formed in the step S304;

step S309, one side, away from the first electrode substrate, of the electron injection layer is evaporated with a second electrode, a material for forming a negative electrode layer is Ag.

Embodiment 4

A difference between a manufacturing method provided by the embodiment and that provided by the embodiment 3 is that:

an ultrasonic spray-coating technology is used for enabling electron transmission and injection layer ink, quantum dot material ink, hole transmission layer ink and hole injection layer ink to respectively enter the sub-pixel areas, an ultrasonic frequency of the above ultrasonic spray-coating technology is 120 kHz.

Embodiment 5

A difference between a manufacturing method provided by the embodiment and that provided by the embodiment 4 is that:

the ultrasonic frequency of the ultrasonic spray-coating technology is 180 kHz.

Embodiment 6

A difference between a manufacturing method provided by the embodiment and that provided by the embodiment 4 is that:

the ultrasonic frequency of the ultrasonic spray-coating technology is 45 kHz.

Embodiment 7

A difference between a manufacturing method provided by the embodiment and that provided by the embodiment 4 is that:

the ultrasonic frequency of the ultrasonic spray-coating technology is 90 kHz.

Embodiment 8

A manufacturing method for a photoluminescence device provided by the embodiment includes the following steps:

step S801, the mask plate prepared by nickel alloy is disposed on the surface of the surface modified substrate in the embodiment 2, 96×64 hollow portions of the mask plate correspond to one group of 96×64 micro-array patterns of a hydrophobic area;

step S802, an inkjet printing (the type is Dimatix Materials Printer DMP-2831) technology is used for enabling hydrophobic red quantum dot ink to enter the hydrophobic area through the hollow portions;

step S803, the quantum dot ink in the hydrophobic area is dried or solidified;

step S804, the above mask plate is disposed on the surface of the above surface modified substrate, 96×64 hollow portions of the mask plate correspond to the other group of 96×64 micro-array patterns of the hydrophobic area;

step S805, the inkjet printing (the type is Dimatix Materials Printer DMP-2831) technology is used for enabling hydrophobic green quantum dot ink to enter the hydrophobic area through the hollow portions;

step S806, the quantum dot ink in the hydrophobic area is dried or solidified, herein, the viscosity of the red and green quantum dot ink is 15 cps, a red quantum dot material is CdSe/ZnS, and a green quantum dot material is CdSe/CdS, hydrophobic ligands on the surfaces of the both parties are oleic acid.

Embodiment 9

A difference between a manufacturing method provided by the embodiment and that provided by the embodiment 8 is that:

the viscosity of the red and green quantum dot ink used in the inkjet printing technology is 5 cps.

Embodiment 10

A difference between a manufacturing method provided by the embodiment and that provided by the embodiment 8 is that:

an ultrasonic spray-coating technology is used for enabling the hydrophobic red quantum dot ink and green quantum dot ink to enter the hydrophobic area through the hollow portions, the ultrasonic frequency of the above ultrasonic spray-coating technology is 120 kHz.

Embodiment 11

A manufacturing method for a surface modified mask plate provided by the embodiment includes the following steps:

step S1101, the mask plate is immerged in solution with a hydrophobic material, the above hydrophobic material is heptadecafluorodecyl trimethoxy silane, so that the hydrophobic material is fixed on the surface of the mask plate;

step S1102, the mask plate fixed with the hydrophobic material is separated from the solution, and the mask plate is dried or solidified;

step S1103, a first photomask is set on a first surface of the mask plate with 96×64 hollow portions, the first photomask is formed by 96×64 first shielding portions and a first light transmitting portion connected with each first shielding portion, the first shielding portions correspond to the hollow portions one by one, and the area of each first shielding portion in one-to one correspondence is greater than the area of each hollow portion, an UV lamp is used for emitting ultraviolet light with 185 nm and 254 nm of wavelengths and the ultraviolet light is enabled to perform 5 min of ultraviolet ozone photolysis oxidization on the first surface of the mask plate through the first photomask, and the UV lamp is used for emitting the ultraviolet light with 185 nm and 254 nm of wavelengths and the ultraviolet light is enabled to perform 5 min of the ultraviolet ozone photolysis oxidization on a second surface, opposite to the first surface, of the mask plate, so that the surface irradiated by the light forms a hydrophilic surface, and the rest surface of the mask plate forms a hydrophobic surface, the hollow portions is surrounded by the hydrophobic surface.

Embodiment 12

A manufacturing method for a surface modified mask plate provided by the embodiment includes the following steps:

step S1201, the mask plate is immerged in solution with a hydrophobic material, the above hydrophobic material is heptadecafluorodecyl trimethoxy silane, so that the hydrophobic material is fixed on the surface of the mask plate;

step S1202, the mask plate fixed with the hydrophobic material is separated from the solution, and the mask plate is dried or solidified;

step S1203, a second photomask is set on the mask plate with 96×64 hollow portions, the first photomask is formed by 96×64 second light transmitting portions and a second shielding portion connected with each second light transmitting portion, the second light transmitting portions correspond to the hollow portions one by one, and the area of each second light transmitting portion in one-to one correspondence is greater than the area of each hollow portion, an UV lamp is used for emitting ultraviolet light with 185 nm and 254 nm of wavelengths and the ultraviolet light is enabled to perform 5 min of the ultraviolet ozone photolysis oxidization on the mask plate through the second photomask, so that the surface, corresponding to the second light transmitting portions, of the mask plate forms the hydrophilic surface, and the rest surface of the mask plate forms the hydrophobic surface, the hollow portions is surrounded by the hydrophilic surface.

Embodiment 13

A manufacturing method for an electroluminescence device provided by the embodiment includes the following steps:

step S1301, a first electrode substrate with a pixel separating structure is provided, the pixel separating structure has 96×64 mutually separated sub-pixel areas, the first electrode substrate is a substrate with a positive electrode layer, and the positive electrode layer is an ITO positive electrode;

step S1302, the surface modified mask plate provided in the embodiment 12 is set on one side, with the pixel separating structure, of the first electrode substrate, hollow portions of the surface modified mask plate correspond to the sub-pixel areas, the surface modified mask plate is provided with a modified surface consisting of a hydrophilic surface and a hydrophobic surface, the hollow portions is surrounded by the hydrophilic surface, and the modified surface except the hydrophilic surface is the hydrophobic surface;

step S1303, an inkjet printing (the type is Dimatix Materials Printer DMP-2831) technology is used for enabling water solution of PEDOT:PSS as hole injection layer ink to enter the corresponding sub-pixel area through the hollow portions;

step S1304, the hole injection layer ink in the sub-pixel area is dried or solidified, so as to form a hole injection layer;

step S1305, the steps of S1302 to S1304 are executed again, in the step S1302 of the above repeated process, the surface modified mask plate provided in the embodiment 11 is used, in the step S1303 of the above repeated process, hole transmission layer ink is used, and the hole transmission layer ink is toluene solution of poly-(9-vinyl) carbazole (PVK), so a hole transmission layer is formed in the step S1304;

step S1306, the steps of S1302 to S1304 are executed again, in the step S1302 of the above repeated process, the surface modified mask plate provided in the embodiment 11 is used, in the step S1303 of the above repeated process, quantum dot material ink is used, and the quantum dot material ink is decane solution of CdSe/CdS, so a light emitting layer is formed in the step S1304;

step S1307, the steps of S1302 to S1304 are executed again, in the step S1302 of the above repeated process, the surface modified mask plate provided in the embodiment 12 is used, in the step S1303 of the above repeated process, electron transmission layer ink and electron injection layer ink are used, and the transmission layer ink and the electron injection layer ink are butyl alcohol solution of ZnO, the electron transmission and injection layers are formed in the step S1304;

step S1308, one side, away from the first electrode substrate, of the electron injection layer is evaporated with a second electrode, a material for forming a negative electrode layer is Ag.

Embodiment 14

A difference between a manufacturing method provided by the embodiment and that provided by the embodiment 13 is that:

an ultrasonic spray-coating technology is used for enabling electron transmission and injection layer ink, quantum dot material ink, hole transmission layer ink and hole injection layer ink to respectively enter the sub-pixel areas, an ultrasonic frequency of the above ultrasonic spray-coating technology is 120 kHz.

Embodiment 15

A difference between a manufacturing method provided by the embodiment and that provided by the embodiment 14 is that:

the ultrasonic frequency of the ultrasonic spray-coating technology is 180 kHz.

Embodiment 16

A difference between a manufacturing method provided by the embodiment and that provided by the embodiment 14 is that:

the ultrasonic frequency of the ultrasonic spray-coating technology is 45 kHz.

Embodiment 17

A difference between a manufacturing method provided by the embodiment and that provided by the embodiment 14 is that:

the ultrasonic frequency of the ultrasonic spray-coating technology is 90 kHz.

Embodiment 18

A manufacturing method for the surface modified light transmitting substrate provided by the embodiment includes the following steps:

the coupling agent and the initiator are mixed in the solvent, to form substrate treating liquid, the surface of one side of the light transmitting substrate is placed in the substrate treating liquid, the coupling agent is bonding-fixed on the surface of the light transmitting substrate and a bonding surface is formed, the first reaction raw material is set on the bonding surface, the first reaction raw material positioned in the first area is covered, and ultraviolet irradiation is performed on the first reaction raw material positioned in the second area, so that a grafting reaction is performed on the first reaction raw material and the coupling agent under the ultraviolet irradiation, so the hydrophobic area is formed, the first reaction raw material in the first area is removed, and a second reaction raw material is set on the first area and the second shielding area, the second reaction raw material positioned in the second shielding area is covered, and the ultraviolet irradiation is performed on the second reaction raw material positioned in the first area, so the grafting reaction is performed on the second reaction raw material and the coupling agent under the ultraviolet irradiation, so the hydrophilic area is formed;

herein, the light transmitting substrate is glass, the coupling agent is chloro-(dimethyl)-vinylsilane, the initiator is 4-dimethylpyridine, the first reaction raw material is 1H,1H, 2H,2H-perfluorodecyl mercaptan, the second reaction raw material is mercaptoethylamine, and the hydrophobic second area corresponds to two groups of 96×64 micro-array patterns.

Embodiment 19

A manufacturing method for a quantum dot film provided by the embodiment adopts the surface modified mask plate in the embodiment 11 and the surface modified light transmitting substrate in the embodiment 18, the manufacturing method includes the following steps:

step S1901, the surface modified mask plate is disposed on the first surface, 96×64 surface modified hollow portions correspond to one group of 96×64 micro-array patterns of a hydrophobic area;

step S1902, an inkjet printing (the type is Dimatix Materials Printer DMP-2831) technology is used for enabling hydrophobic red quantum dot ink to enter the hydrophobic area through the hollow portions;

step S1903, the quantum dot ink in the hydrophobic area is dried or solidified;

step S1904, the surface modified mask plate is disposed on the first surface, 96×64 surface modified hollow portions correspond to the other group of 96×64 micro-array patterns of the hydrophobic area;

step S1905, the inkjet printing (the type is Dimatix Materials Printer DMP-2831) technology is used for enabling hydrophobic green quantum dot ink to enter the hydrophobic area through the hollow portions;

step S1906, the quantum dot ink in the hydrophobic area is dried or solidified, herein, the viscosity of the red and green quantum dot ink is 15 cps, a red quantum dot material is CdSe/ZnS, and a green quantum dot material is CdSe/CdS, hydrophobic ligands on the surfaces of the both parties are oleic acid.

Embodiment 20

A difference between a manufacturing method provided by the embodiment and that provided by the embodiment 19 is that:

the viscosity of the red and green quantum dot ink used in the inkjet printing technology is 5 cps.

Embodiment 21

A difference between a manufacturing method provided by the embodiment and that provided by the embodiment 19 is that:

an ultrasonic spray-coating technology is used for enabling the hydrophobic red quantum dot ink and green quantum dot ink to enter the hydrophobic area through the hollow portions, the ultrasonic frequency of the above ultrasonic spray-coating technology is 120 kHz.

Embodiment 22

A difference between a manufacturing method provided by the embodiment and that provided by the embodiment 21 is that:

the ultrasonic frequency of the ultrasonic spray-coating technology is 45 kHz.

Contrast Example 1

A manufacturing method for an electroluminescence device provided by the contrast example includes the following steps:

step Sd101, a first electrode substrate with a pixel separating structure is provided, the pixel separating structure has 96×64 mutually separated sub-pixel areas, the first electrode substrate is a substrate with a positive electrode layer;

step Sd102, an inkjet printing (the type is Dimatix Materials Printer DMP-2831) technology is used for enabling hole injection layer ink to enter the sub-pixel area;

step Sd103, the hole injection layer ink in the sub-pixel area is dried or solidified, so as to form a hole injection layer;

step Sd104, the steps of Sd102 to Sd103 are executed again, in the step Sd103 of the above repeated process, hole transmission layer ink, quantum dot material ink, and electron transmission layer ink are respectively used, so a hole transmission layer, a light emitting layer and an electron transmission layer are formed in a sequence of the step Sd104;

step Sd105, one side, away from the first electrode substrate, of the electron transmission layer is provided with a second electrode, herein, the hole transmission layer ink, the electron transmission layer ink, the quantum dot material ink, the hole transmission layer ink and the hole injection layer ink are the same as that in the embodiment 3.

Contrast Example 2

A manufacturing method for a photoluminescence device provided by the contrast example includes the following steps:

step Sd201, a first surface of a light transmitting substrate is coated by a photoresist, and exposure and development are successively performed to form a pixel separating structure, the pixel separating structure has two groups of 96×64 mutually separated sub-pixel areas, and the naked surface of the pixel separating structure is a hydrophilic surface, the neighboring side wall of a separating matrix in the pixel separating structure is perpendicular to the substrate, the separating matrix between the neighboring side walls is a separating bar, and the surface of one side, away from the substrate, of the separating bar is a plane;

step Sd202, a light transmitting substrate of the pixel separating structure is spin-coated by a red quantum dot material, and roasting treatment, exposure treatment, development treatment and drying treatment are successively performed on the light transmitting substrate provided with the red quantum dot material, and 96×64 red quantum dot arrays are obtained;

step Sd203, the above substrate is spin-coated by a green quantum dot material, and the roasting treatment, exposure treatment, development treatment and drying treatment are successively performed on the light transmitting substrate provided with the green quantum dot material, and 96×64 red quantum dot arrays are obtained, herein, the light transmitting substrate is glass, the red quantum dot material includes CdSe/ZnS, the green quantum dot material includes CdSe/CdS, and the viscosity of the quantum dot material ink is 15 cps.

Contrast Example 3

A manufacturing method for an electroluminescence device provided by the contrast example includes the following steps:

step Sd301, a first electrode substrate with a pixel separating structure is provided, the pixel separating structure has 96×64 mutually separated sub-pixel areas, the first electrode substrate is a substrate with a positive electrode layer;

step Sd302, a precision inkjet printing device (a Jetlabll high-precision nano-material deposition inkjet printing system) is used for enabling hole injection layer ink to enter the sub-pixel area;

step Sd303, the hole injection layer ink in the sub-pixel area is dried, so as to form a hole injection layer;

step Sd304, the steps of Sd302 to Sd303 are executed again, in the step Sd303 of the above repeated process, hole transmission layer ink, quantum dot material ink, and electron transmission layer ink are respectively used, so a hole transmission layer, a light emitting layer and an electron transmission layer are formed in a sequence of the step Sd304;

step Sd305, one side, away from the first electrode substrate, of the electron transmission layer is provided with a second electrode, herein, the hole transmission layer ink, the electron transmission layer ink, the quantum dot material ink, the hole transmission layer ink and the hole injection layer ink are the same as that in the embodiment 13.

An electrifying test is performed on the electroluminescence devices in the above embodiments 3 to 7 and the contrast example 1, a circuit is controlled so that only a red sub-pixel or a green sub-pixel emits light independently, and a spectrum scanning brightness meter (PR670) is used for uniformly selecting two positions on the electroluminescence device for testing a color coordinate thereof, a test result is as shown in table 1.

TABLE 1

| Embodiment | R1 (x, y) | R2 (x, y) | G1 (x, y) | G2 (x, y) |
|---|---|---|---|---|
| Embodiment 3 | 0.6750, 0.3222 | 0.6751, 0.3223 | 0.1875, 0.7415 | 0.1888, 0.7431 |
| Embodiment 4 | 0.6752, 0.3220 | 0.6755, 0.3224 | 0.1898, 0.7435 | 0.1885, 0.7431 |

TABLE 1-continued

| Embodiment | R1 (x, y) | R2 (x, y) | G1 (x, y) | G2 (x, y) |
|---|---|---|---|---|
| Embodiment 5 | 0.6755, 0.3221 | 0.6753, 0.3229 | 0.1936, 0.7425 | 0.1945, 0.7418 |
| Embodiment 6 | 0.6749, 0.3225 | 0.6754, 0.3220 | 0.1882, 0.7418 | 0.1877, 0.7434 |
| Embodiment 7 | 0.6751, 0.3224 | 0.6748, 0.3225 | 0.1910, 0.7410 | 0.1900, 0.7435 |
| Embodiment 1 | 0.6032, 0.3026 | 0.6147, 0.3004 | 0.3117, 0.5616 | 0.3097, 0.5775 |

It may be apparently observed from the above test result that the electroluminescence devices obtained by the manufacturing technologies of using the combination of the normal inkjet printing and the mask plate or the combination of the ultrasonic spray-coating and the mask plate in the above embodiments 3 to 7 have the better consistency of the color coordinates; and the change of the color coordinate of the electroluminescence device obtained by only using the manufacturing technology of the normal inkjet printing in the above contrast example 1 is large extremely, and an apparent color mixture phenomenon may be observed from a value of the color coordinate.

In addition, after a sealing protecting layer is respectively applied to the photoluminescence devices in the above embodiments 8 to 10 and the contrast example 2, the photoluminescence devices are set on the light emitting side of a blue electroluminescence device (BOLED), a control circuit only allows blue backlight corresponding to the red sub-pixel or the green sub-pixel to emit light independently, under the stimulation of blue light, the corresponding red quantum dot or green quantum dot performs the photoluminescence, the spectrum scanning brightness meter (PR670) is used for uniformly selecting two positions on a light emitting surface for testing the color coordinate thereof, a test result is as shown in table 2.

TABLE 2

| Embodiment | R1 (x, y) | R2 (x, y) | G1 (x, y) | G2 (x, y) |
|---|---|---|---|---|
| Embodiment 8 | 0.6755, 0.3219 | 0.6752, 0.3225 | 0.1898, 0.7454 | 0.1878, 0.7424 |
| Embodiment 9 | 0.6751, 0.3220 | 0.6751, 0.3225 | 0.1870, 0.7473 | 0.1904, 0.7427 |
| Embodiment 10 | 0.6745, 0.3222 | 0.6755, 0.3214 | 0.1941, 0.7429 | 0.1936, 0.7425 |
| Comparison example 2 | 0.6748, 0.3225 | 0.6754, 0.3230 | 0.1895, 0.7447 | 0.1889, 0.7456 |

It may be apparently observed from the above test result that the photoluminescence devices obtained by the manufacturing technologies of using the combination of the normal inkjet printing and the mask plate or the combination of the ultrasonic spray-coating and the mask plate have the better consistency of the color coordinates, and the consistency is equivalent to that of the photoluminescence device obtained by using a conventional exposure developing device in the above contrast example 2, but the preparation cost is reduced.

Figure 4:
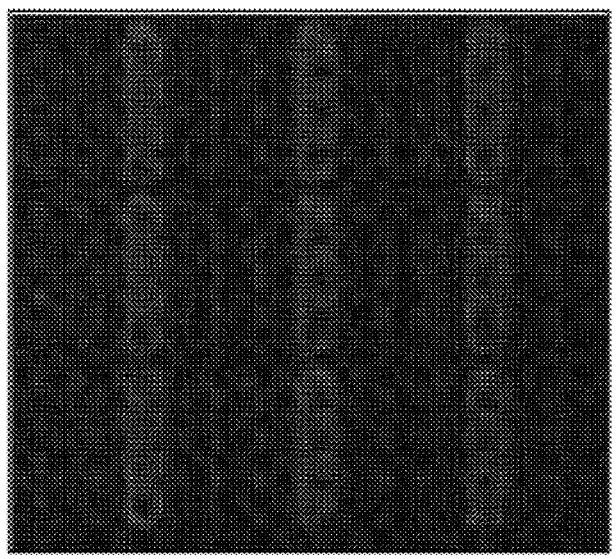
FIG. 4 shows an optical microscope picture of a sub-pixel area after executing the step S1306 in an embodiment 13 of the disclosure.

An optical microscope is used for acquiring an optical microscope diagram of the sub-pixel area after the step S1306 is executed in the embodiment 13, in a dark environment, the UV lamp with 365 nm of the wavelength is used for irradiating the quantum dots to perform the photoluminescence, as shown in FIG. 4, it may be observed from the figure that the red quantum dot ink are basically positioned in the sub-pixel area, the shape is regular, and the irrelevant area has no the ink residue; and the spectrum scanning brightness meter (PR670) is used for testing the photoelectric properties of the electroluminescence devices in the above embodiments 13 to 17 and the contrast example 3, a test result is as shown in table 3 below:

TABLE 3

| Name | External Quantum Efficiency (EQE) % |
|---|---|
| Embodiment 13 | 11.24 |
| Embodiment 14 | 11.18 |
| Embodiment 15 | 11.48 |
| Embodiment 16 | 11.16 |
| Embodiment 17 | 11.46 |
| Comparison example 3 | 11.36 |

It may be observed from the above test result that me photoelectric properties of the electroluminescence devices obtained by the manufacturing technologies of using the combination of the normal inkjet printing and the mask plate or the combination of the ultrasonic spray-coating and the mask plate are equivalent to that of the electroluminescence devices prepared by the precision inkjet printing.

Contrast Example 4

A manufacturing method for a photoluminescence quantum dot film provided by the contrast example includes the following steps:

step Sd401, a first surface of a light transmitting substrate is coated by a photoresist, and exposure and development are successively performed to form a pixel separating structure, the pixel separating structure has two groups of 96×64 mutually separated sub-pixel areas, and the naked surface of the pixel separating structure is a hydrophilic surface, the neighboring side wall of a separating matrix in the pixel separating structure is perpendicular to the substrate, the separating matrix between the neighboring side walls is a separating bar, and the surface of one side, away from the substrate, of the separating bar is a plane;

step Sd402, the surface modified mask plate is set on the first surface, 96×64 hollow portions of the mask plate correspond to a group of the sub-pixel areas;

step Sd403, an inkjet printing technology is used for enabling hydrophobic red quantum dot ink to enter a hydrophobic area through the hollow portions;

step Sd404, the red quantum dot ink in the hydrophobic area is dried;

step Sd405, the surface modified mask plate is set on the first surface, 96×64 hollow portions of the mask plate correspond to the other group of the sub-pixel areas;

step Sd406, the inkjet printing technology is used for enabling hydrophobic green quantum dot ink to enter the hydrophobic area through the hollow portions;

step Sd407, the green quantum dot ink in the hydrophobic area is dried, herein, the light transmitting substrate is glass, a material forming the above naked surface is polyimide, the red quantum dot material ink includes CdSe/ZnS, the green quantum dot material includes CdSe/CdS, and the viscosity of the quantum dot material ink is 15 cps.

Contrast Example 5

A difference between the manufacturing method provided by the contrast example and that in the contrast example 4 is that, through respectively spin-coating red and green quantum dot material, a red and green alternated quantum dot film is obtained through multiple times of exposure, the method specifically includes the following steps:

step Sd501, a light transmitting substrate with a pixel separating structure is spin-coated by a red quantum dot material, and roasting treatment, exposure treatment, development treatment and drying treatment are successively performed on the light transmitting substrate provided with the red quantum dot material;

step Sd502, the above substrate is spin-coated by a green quantum dot material, and the roasting treatment, exposure treatment, development treatment and drying treatment are successively performed on the light transmitting substrate provided with the green quantum dot material, herein, 96×64 red quantum dot arrays and 96×64 green quantum dot arrays are respectively obtained in the step Sd501 and the step Sd502.

After a sealing protecting layer is respectively applied to the quantum dot film in the above embodiments 19 to 22 and the contrast examples 4 to 5, the quantum dot film is set on the light emitting side of a blue electroluminescence device (BOLED), the electroluminescence device includes a blue LED lamp bead packaged by orderly stacked epoxy resins and a light diffusion plate. An integrating sphere is used for integrating the photoluminescence spectrum areas of the red and green quantum dots, the obtained photoluminescence efficiencies of the red and green quantum dots are as shown in table 4 below:

TABLE 4

| Embodiment No. | Photoluminescence efficiencies of the red quantum dots | Photoluminescence efficiencies of the green quantum dots |
|---|---|---|
| Embodiment 19 | 41% | 32% |
| Embodiment 20 | 46% | 36% |
| Embodiment 21 | 45% | 37% |
| Embodiment 22 | 43% | 33% |
| Comparison example 4 | 44% | 35% |
| Comparison example 5 | 42% | 31% |

It may be observed from the above test result that the photoluminescence efficiencies of the red quantum dot and the green quantum dot obtained by the implementation modes of the disclosure are equivalent to a traditional technology, or even improved, but the manufacturing cost is greatly reduced.

It may be observed from the above description that the above embodiments of the disclosure realize the following technical effects:

1, a technical scheme of the combination of the mask plate and the solution method is used for forming a light emitting layer or a functional layer, the mask plate is used for preventing ink from being dispersed to other color areas, a color mixture problem is effectively avoided, and the color accuracy of the light emitting device is improved;

2, through the combination of the pix separating structure and the mask plate, a spray-coating technology in the solution method may be used for manufacturing the pixel, and an inkjet printing device in lower precision may be used for manufacturing the pixel, the needed cost of using a precision inkjet printing device is reduced;

3, the mask plate with the modified surface may be used for enabling ink with different hydrophobicity-hydrophilicity to accurately enter the corresponding sub-pixel area, and the pixel separating structure is used for preventing the ink color mixture between the different sub-pixel areas, because the mask plate is placed and used at the upper end of the pixel separating structure, while a faceplate is manufactured in large area, the surrounding of the hollow portions is not easily deformed because of the support of the pixel separating structure, so a color difference or other performance problems which are caused by the different injection quantities of the ink in the different sub-pixel areas or the injection deviation are effectively solved;

4, through a hydrophilic area and a hydrophobic area on a light transmitting substrate, multiple separated sub-pixel areas are formed on the surface of the light transmitting substrate, the hydrophilic quantum dot ink is enabled to enter the hydrophilic area, the hydrophobic area is used as a separating structure, or the hydrophobic quantum dot ink enters the hydrophobic area, and the hydrophilic area is used as the separating structure, thereby a problem that the color accuracy is reduced because of the quantum dot ink color mixture in the different sub-pixel areas is effectively solved;

5, compared with a manufacturing method for installing the pixel separating structure on a transparent substrate, the above manufacturing method of the application is capable of enabling the ink to be injected to the needed sub-pixel area, and reducing the manufacturing cost of a quantum dot film.

The above are only the preferable embodiments of the disclosure, and not intended to limit the disclosure, it is to be noted by those skilled in the art that the disclosure may has various modifications and variations. Any modifications, equivalent replacements, improvements and the like made within the sprint and principle of the disclosure shall fall within the scope of protection of the disclosure.

What is claimed is:

1. A manufacturing method for a light emitting device, comprising the following steps:
    step S1: disposing a mask plate having a plurality of hollow portions on a substrate;
    step S2: applying, by using a solution method, ink on a surface of the substrate by using the hollow portions; and
    step S3: drying or solidifying the ink on the surface of the substrate to form a light emitting layer or a functional layer;
    the substrate in the step S1 is provided with a pixel separating structure, and the pixel separating structure is provided with multiple mutually separated sub-pixel areas, and the hollow portions are set corresponding to each sub-pixel area; and
    in the step S2, the ink enters the corresponding sub-pixel area through the hollow portions;
    the surface of the substrate in the step S1 has a hydrophilic area and a hydrophobic area, the hollow portions are set corresponding to the hydrophilic area or the hydrophobic area; and
    in the step S2, the hydrophobic ink enters the hydrophobic area through the hollow portions, or the hydrophilic ink enters the hydrophilic area through the hollow portions.

2. The manufacturing method as claimed in claim 1, wherein the ink is a quantum dot material ink, the manufacturing method further comprises a process of at least one time of repeatedly performing the step S1 to the step S3, in each time of the repeated process, the hollow portions of the used mask plate correspond to different areas of the substrate, the light emitting colors of the used ink are different.

3. The manufacturing method as claimed in claim 2, wherein
    the mask plate in the step S1 has a modified surface, the modified surface includes a surface of one side, away from the substrate, of the mask plate, the modified surface has the hydrophilicity or hydrophobicity; and the ink used in the step S2 and the modified surface have the different hydrophobicity-hydrophilicity.

4. The manufacturing method as claimed in claim 2, wherein the manufacturing method further comprises a process of pre-processing the mask plate, the pre-processing process comprises the following steps:

performing ultraviolet ozone photolysis oxidization on the surface of the mask plate, so that the hydrophilic surface of the mask plate is completely exposed.

5. The manufacturing method as claimed in claim 2, wherein the substrate in the step S1 is provided with a pixel separating structure, and the pixel separating structure is provided with multiple mutually separated sub-pixel areas, and the hollow portions are set corresponding to each sub-pixel area; and in the step S2, the ink enters the corresponding sub-pixel area through the hollow portions.

6. The manufacturing method as claimed in claim 2, wherein the surface of the substrate in the step S1 has a hydrophilic area and a hydrophobic area, the hollow portions are set corresponding to the hydrophilic area or the hydrophobic area; and in the step S2, the hydrophobic ink enters the hydrophobic area through the hollow portions, or the hydrophilic ink enters the hydrophilic area through the hollow portions.

7. The manufacturing method as claimed in claim 2, wherein in the step S2, a spray-coating technology or an inkjet printing technology is used so that the ink is disposed on the surface of the substrate through the hollow portions.

8. The manufacturing method as claimed in claim 1, wherein the mask plate in the step S1 has a modified surface, the modified surface includes a surface of one side, away from the substrate, of the mask plate, the modified surface has the hydrophilicity or hydrophobicity; and the ink used in the step S2 and the modified surface have the different hydrophobicity-hydrophilicity.

9. The manufacturing method as claimed in claim 8, wherein the modified surface further comprises a surface of one side, adjacent to the substrate, of the mask plate.

10. The manufacturing method as claimed in claim 9, wherein while the modified surface is a hydrophobic surface, the manufacturing method further comprises a process of forming the modified surface, the process of forming the modified surface includes the following steps:

step S01, immerging the mask plate in solution with a hydrophobic material, so that the hydrophobic material is fixed on the surface of the mask plate, preferably the hydrophobic material is a fluoric silane coupling agent; and step S02, separating the mask plate fixed with the hydrophobic material from the solution, and drying the mask plate, so as to form the modified surface with the hydrophobicity.

11. The manufacturing method as claimed in claim 1, wherein the manufacturing method further comprises a process of pre-processing the mask plate, the pre-processing process comprises the following steps:

performing ultraviolet ozone photolysis oxidization on the surface of the mask plate, so that the hydrophilic surface of the mask plate is completely exposed.

12. The manufacturing method as claimed in claim 1, wherein the ink is any one of a hole injection material ink, a hole transmission material, an electron injection material ink or an electron transmission material ink, in the step S3, the ink is dried, so as to form a corresponding hole injection layer, a hole transmission layer, an electron injection layer or an electron transmission layer; or the ink is the quantum dot material ink or an organic light emitting material ink, in the step S3, the ink is dried, so as to form a corresponding quantum dot light emitting layer or an organic light emitting layer.

13. The manufacturing method as claimed in claim 1, wherein the ink is an electrode material ink, in the step S3, the ink is dried, so as to form a corresponding electrode layer.

14. The manufacturing method as claimed in claim 1, wherein the ink is any one of the hole injection material ink, the hole transmission material ink, the electron injection material ink, the electrode material ink or the electron transmission material ink, in the step S3, the ink is solidified, so as to form a corresponding hole injection layer, a hole transmission layer, an electron injection layer, an electrode layer or an electron transmission layer; or the ink is the quantum dot material ink or the organic light emitting material ink, in the step S3, the ink is solidified, so as to form a corresponding quantum dot light emitting layer or an organic light emitting layer.

15. The manufacturing method as claimed in claim 1, wherein in the step S2, a spray-coating technology or an inkjet printing technology is used so that the ink is disposed on the surface of the substrate through the hollow portions.

16. A light emitting device, wherein the light emitting device is prepared by the manufacturing method as claimed in any one of claim 1, wherein the light emitting device is an electroluminescence device or a photoluminescence device.

17. A hybrid light emitting device, wherein the hybrid light emitting device comprise an electroluminescence device and a photoluminescence device set on the light emitting side of the electroluminescence device, wherein the electroluminescence device and/or the photoluminescence device is prepared according to the manufacturing method as claims in any one of claim 1.

18. The manufacturing method as claimed in claim 1, wherein the spray-coating technology is ultrasonic spray-coating.

* * * * *